United States Patent [19]
Uzawa et al.

[11] Patent Number: 6,097,495
[45] Date of Patent: *Aug. 1, 2000

[54] ALIGNING METHOD

[75] Inventors: Shigeyuki Uzawa, Nakamachi; Akiya Nakai; Masaaki Imaizumi, both of Tokyo; Hiroshi Tanaka; Noboru Takakura, both of Yokohama; Yoshio Kaneko, Tokyo, all of Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 09/102,752

[22] Filed: Jun. 23, 1998

Related U.S. Application Data

[62] Division of application No. 08/139,059, Oct. 21, 1993, which is a continuation of application No. 08/040,081, Mar. 30, 1993, abandoned, which is a continuation of application No. 07/520,248, May 7, 1990, abandoned.

[30] Foreign Application Priority Data

May 8, 1989 [JP] Japan .................................. S1-115684

[51] Int. Cl.$^7$ .................................................. G01B 11/00
[52] U.S. Cl. ............................ 356/401; 250/548; 356/363
[58] Field of Search ..................................... 356/399, 400, 356/401; 250/548, 559.3

[56] References Cited

U.S. PATENT DOCUMENTS

| | | |
|---|---|---|
| 3,946,212 | 3/1976 | Nakao et al. . |
| 4,238,780 | 12/1980 | Doemens . |
| 4,644,480 | 2/1987 | Haruna et al. . |
| 4,780,617 | 10/1988 | Umatate et al. . |
| 4,843,563 | 6/1989 | Takahashi et al. . |
| 4,849,901 | 7/1989 | Shimizu . |
| 4,971,444 | 11/1990 | Kato . |
| 4,977,328 | 12/1990 | Van Vucht . |
| 5,020,006 | 5/1991 | Sporon-Fiedler . |
| 5,153,678 | 10/1992 | Ota .......................................... 356/401 |
| 5,543,921 | 8/1996 | Uzawa et al. ............................ 356/401 |

FOREIGN PATENT DOCUMENTS

| | | |
|---|---|---|
| 59-027525 | 2/1984 | Japan . |
| 61-114529 | 6/1986 | Japan . |
| 62-291133 | 12/1987 | Japan . |
| 63-232321 | 9/1988 | Japan . |

*Primary Examiner*—Samuel A. Turner
*Attorney, Agent, or Firm*—Fitzpatrick, Cella, Harper & Scinto

[57] ABSTRACT

An aligning method suitably usable in a semiconductor device manufacturing exposure apparatus of step-and-repeat type, for sequentially positioning regions on a wafer to an exposure position. In one preferred form, the marks provided on selected regions of the wafer are detected to obtain corresponding mark signals and then respective positional data related to the positions or positional errors of the selected regions are measured, on the basis of the mark signals. Then, the reliability of each measured positional data of a corresponding selected region is detected, on the basis of the state of a corresponding mark signal or the state of that measured positional data and by using fuzzy reasoning, for example. Corrected positional data related to the disposition of all the regions on the wafer is then prepared by using the measured positional data of the selected regions, wherein, for preparation of the corrected positional data, each measured positional data is weighted in accordance with the detected reliability thereof such that measured positional data having higher reliability is more influential to determine the corrected positional data. For sequential positioning of the regions on the wafer to the exposure position, the wafer movement is controlled on the basis of the prepared corrected positional data, whereby high-precision alignment of each region is assured.

6 Claims, 17 Drawing Sheets

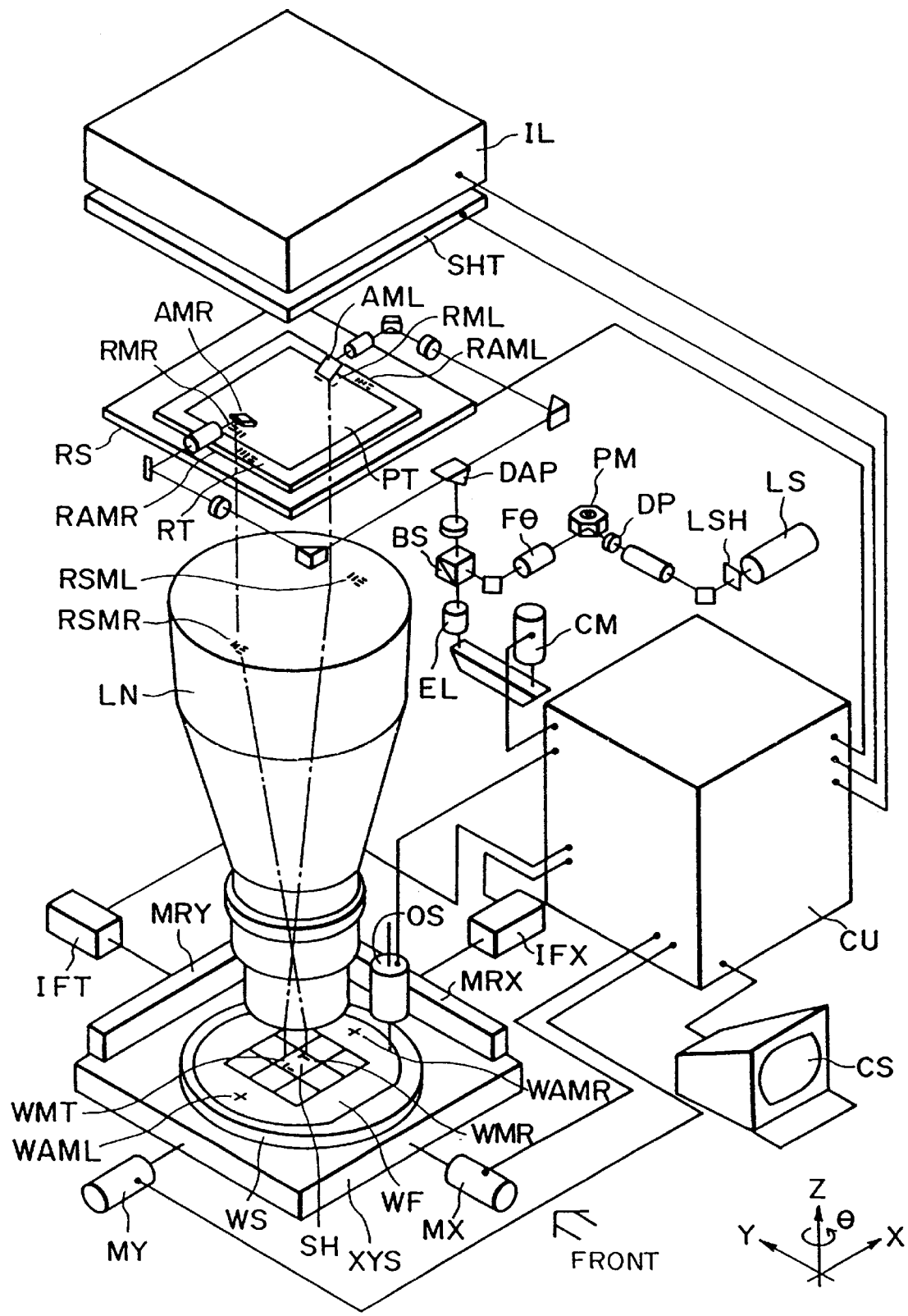
F I G. 1

(a)

(b)

(c)

(a)

(b)

(a)

(b)

ALIGNING METHOD

This application is a divisional of application Ser. No. 08/139,059, filed Oct. 21, 1993, pending, which application is a continuation of application Ser. No. 08/040,081, filed Mar. 30, 1993, abandoned, which application is a continuation of application Ser. No. 07/520,248, filed May 7, 1990, abandoned.

FIELD OF THE INVENTION AND RELATED ART

This invention relates to an aligning method for correctly positioning different portions of a workpiece to a desired site in sequence. More particularly, the invention is concerned with an aligning method usable in a semiconductor device manufacturing step-and-repeat type exposure apparatus, for measuring positions or positional errors related to some of the shot areas on a semiconductor wafer, then for determining from the results the disposition of all of the shot areas of the wafer and for correctly positioning these shot areas of the wafer in sequence to a site related to a reticle (photomask) on the basis of the thus determined shot disposition.

As an aligning method usable in a semiconductor device manufacturing step-and-repeat type exposure apparatus (stepper), for correctly positioning different shot areas of a wafer to a site related to a reticle (photomask), a proposal has been made in Japanese Laid-Open Patent Application, Laid-Open No. Sho 63-232321 filed in the name of the assignee of the subject application. According to this proposal, positions or positional errors related to some shot areas on a semiconductor wafer are measured and, by using the results, the disposition of all the shot areas on the wafer is determined. Then, by using the thus determined shot disposition, the wafer is moved stepwise so as to correctly position each shot area of the wafer with respect to a site related to a reticle (photomask), in a predetermined order.

SUMMARY OF THE INVENTION

More specifically, in the aligning method according to this proposal, any extraordinary value or values included in the measured position data are rejected and, from the measured positional data related to some shot areas, the disposition of all the shot areas on the wafer is determined by using a statistical method, for example. However, during this determination, all the measured positional data are processed on an assumption that they have the same reliability. Accordingly, in this aligning method, those measured positional data having high reliability and those measured data having lower reliability, have the same influence upon determination of the shot disposition (chip disposition).

Such a difference in reliability of the measured data may be disregarded from the standpoint of conventionally required alignment precision. However, in consideration of increasing resolving power of a stepper which requires corresponding enhancement of the alignment precision, such a difference in reliability of the measured data should be considered.

In this respect, it is accordingly a primary object of the present invention to provide an improved aligning method which ensures further enhancement of the alignment precision.

It is another object of the present invention to provide an aligning method usable, for example, in a semiconductor device manufacturing step-and-repeat type exposure apparatus, for measuring positions or positional errors related to some shot areas on a semiconductor wafer, then for determining from the results the disposition of all the shot areas of the wafer and for correctly positioning each shot area of the wafer to a site related to a reticle on the basis of the thus determined shot disposition, with enhanced alignment precision.

In accordance with an aspect of the present invention, to achieve at least one of these objects, the reliability of each measured positional data is determined on the basis of the state of each mark detection signal (mark signal) obtained as a result of detection of each mark provided in each shot area, or on the basis of the state of each measured positional data related to each shot area. Then, from values related to these measured positional data having been weighted in accordance with the determined reliability, the disposition (corrected position data) of all the shot areas of a wafer (workpiece) is determined. This means that those measured position data having high or higher reliability, have stronger influence upon determination of the shot disposition and, therefore, the alignment precision can be enhanced.

In accordance with an aspect of the present invention, the reliability of each measured positional data is determined on the basis of fuzzy reasoning, from the states of mark signals obtained from alignment marks of shot areas or, alternatively, from the states of measured positional data of the shot areas. The fuzzy reasoning is a best method for determination of the reliability of each measured positional data by using plural conditional propositions.

In accordance with another aspect of the present invention, the determined shot disposition may be represented by an approximation function and, on that occasion, the square or absolute value of a difference (hereinafter "remainder") between the actual position of each shot area as represented by a corresponding measured positional data and the position of that shot area as represented by the approximation function, may be weighted in accordance with the reliability of the corresponding measured positional data, and the approximation function may be determined so that the sum of the weighted remainders is reduced to a minimum. This makes it possible to determine the approximation function so as to ensure that those measured positional data having high or higher reliability are more influential than those measured positional data having low or lower reliability.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a perspective view, schematically showing a semiconductor device manufacturing step-and-repeat type exposure apparatus according to an embodiment of the present invention.

FIG. 5($b$) is a schematic illustration showing waveforms of mark signals related thereto.

DESCRIPTION OF THE PREFERRED EMBODIMENTS

Referring first to FIG. 1, which shows a semiconductor device manufacturing step-and-repeat type exposure apparatus according to an embodiment of the present invention, denoted at RT is a reticle having a pattern PT for manufacture of semiconductor devices; at WF is a semiconductor wafer having a number of shot areas (chips) SH formed thereon; at LN is a projection lens system for projecting in a reduced scale the pattern PT of the reticle RT onto one shot area SH of the wafer WF at a time; at CU is a control unit for controlling the stepper as a whole; and at CS is a console to be used for supplying necessary information such as alignment data, exposure data and the like into the control unit CU.

Figure 2:
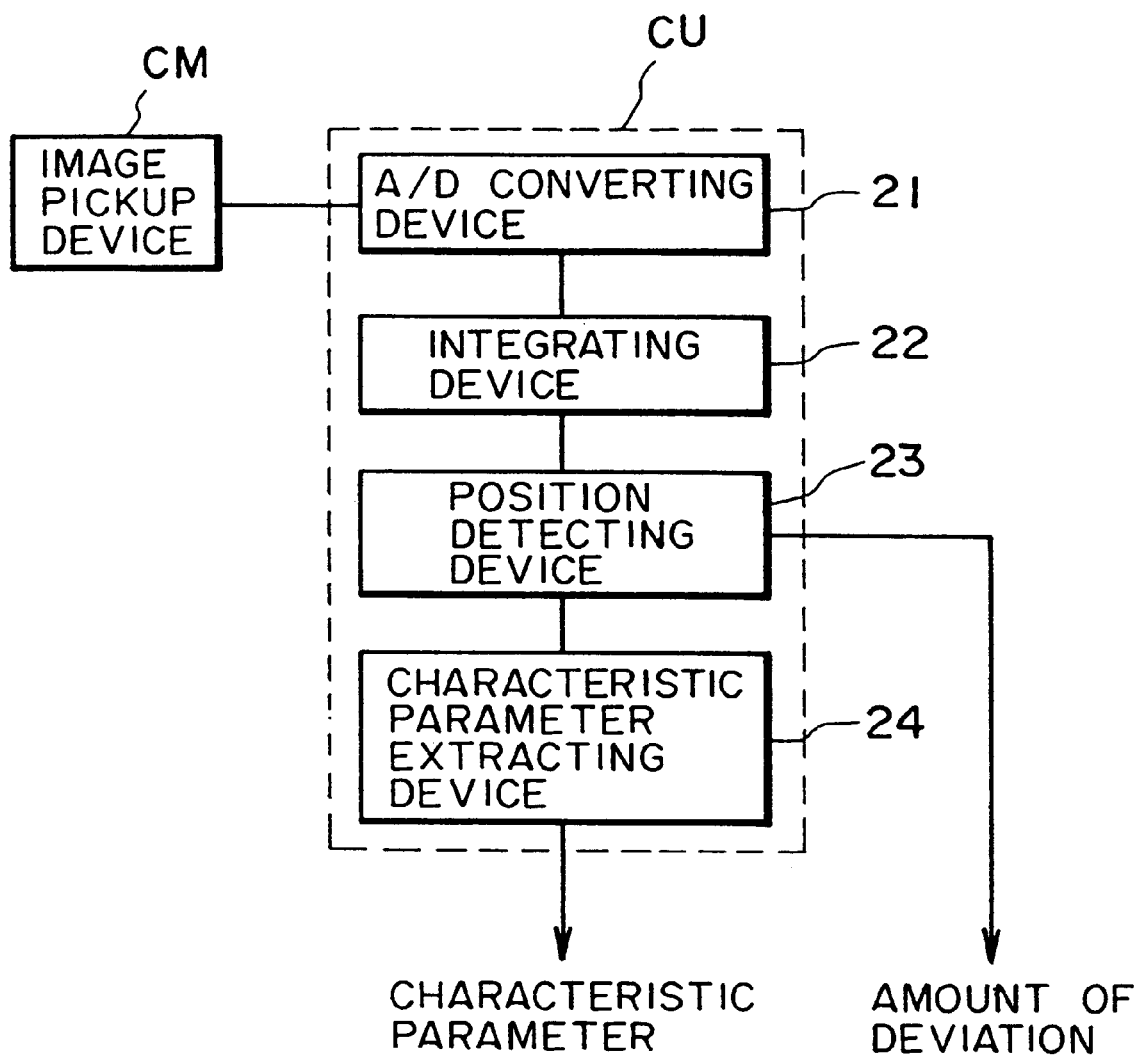
FIG. 2 is a schematic representation, showing details of a control unit used in the FIG. 1 embodiment.

The control unit CU includes computers, memories, an image processing device, an X-Y stage control device and so on. Also, there is provided an image pickup device CM and, in order to obtain the amount of positional deviation of a mark being examined as well as a characteristic parameter (reliability) related thereto from a video signal of the image pickup device CM, as shown in FIG. 2 there are provided an analog-to-digital converting device (hereinafter A/D converting device) 21 for quantizing the video signals from the image pickup device CM; an integrating device 22 for integrating the quantized video signals from the A/D converting device 21, with respect to a predetermined direction; a position detecting device 23 for detecting the positional deviation of the mark on the basis of an integrated signal from the integrating device 22; and a characteristic parameter extracting device 24 for extracting the characteristic parameter (reliability) of the positional deviation as detected by the position detecting device 23. The structure will be described later in detail.

The reticle RT is attracted to and held by a reticle stage RS which is movable in X, Y and θ directions in accordance with an instruction signal from the control unit CU. The reticle RT is provided with reticle alignment marks RAMR and RAML to be used to position the reticle RT into a predetermined positional relationship with the projection lens system LN, as well as reticle marks RMR and RML to be used for detection of the positional relationship between the reticle RT and each shot area SH of the wafer WF.

Reticle setting marks RSMR and RSML are formed on a stationary member fixed to the barrel of the projection lens system LN, so that these setting marks are in a predetermined positional relationship with the projection lens system LN. For correct positioning of the reticle RT with respect to the projection lens system LN, an image of the set of marks RAMR and RSMR and an image of the set of marks RAML and RSML are superposed one upon another on the image pickup device CM and, then, the control unit CU operates to move the reticle stage RS so as to reduce the relative positional deviation between them, detected from the video signal, to a predetermined tolerance.

The wafer WF is attracted to and held by a wafer stage WS. The wafer stage WS is operable to displace the wafer WF relative to an X-Y stage XYS, in the Z and θ directions. Denoted at MX and MY are motors for moving the X-Y stage XYS in the X and Y directions; at MRX and MRY are mirrors fixedly secured to the X-Y stage XYS, and at IFX and IFY are laser interferometers. By means of these laser interferometers IFX and IFY as well as the mirrors MRX and MRY, the position in X-Y coordinates of the X-Y stage XYS for moving the wafer WF in the X and Y directions can be monitored. Further, by means of the motors MX and MY, the X-Y stage can be moved to a position designated by the control unit CU. Even after completion of the movement, the control unit CU operates to hold the X-Y stage XYS at the designated position on the basis of the outputs of the laser interferometers IFX and IFY.

FIG. 3A and 3B show details of the wafer WF. Through the preceding exposure process or processes, a number of patterns (shot areas SH) are formed on the wafer WF which patterns are arrayed approximately along the X and Y directions. Further, wafer alignment marks WAML and WAMR are formed on the wafer. In each shot area SH, wafer marks WML and WMR are formed with an interspace MS. It is to be noted here that design positions of the wafer alignment marks WAML and WAMR, design positions of the individual shot areas SH and design positions of the wafer marks WML and WMR of each shot area SH, with respect to the X-Y coordinates as the wafer WF is attracted to and held by the wafer stage WS (FIG. 1), as well as the design value of the mark interspace MS, are inputted in preparation into the control unit CU from the console CS.

In FIG. 3A, those shot areas as hatched by oblique lines or vertical lines are the sample shot areas to be selected as the subject of measurement during the positional deviation measurement for alignment of each shot area SH of the wafer WF with the reticle RT. Hereinafter, those shot areas as hatched by oblique lines will be referred to as "preparatory sample shot areas" (SS1, SS3, SS5 and SS7) while, on the other hand, those shot areas as hatched by oblique lines or vertical lines will be referred to as "sample shot areas" (SS1–SS8), for distinction from the other shot areas. Also, the sites of these sample shot areas SS1–SS8 have been inputted into the control unit CU from the console CS, like the case of the marks as described.

Referring back to FIG. 1, denoted at OS is an off-axis scope for observing the images of the wafer alignment marks WAML and WAMR of the wafer WF, for detection of their positions in the X-Y coordinates. The off-axis scope OS is securely fixed to the projection lens system LN so that a predetermined positional relationship is maintained therebetween. Denoted at IL is an illumination device for illuminating the reticle RT with light of a predetermined printing wavelength or wavelengths when the pattern PT of the reticle RT is to be printed on a shot area SH of the wafer WF through the projection lens system. Shutter SHT is provided to control the amount of exposure for the pattern printing. The illumination device and the shutter operate in accordance with the instruction signals from the control unit CU.

Denoted at LS is a laser source for producing laser light of a wavelength substantially the same as the printing wavelength. When, for detection of relative positional deviation between a certain wafer shot area SH and the pattern PT of the reticle RT through the projection lens system, the set of reticle mark RML and wafer mark WML and the set of reticle mark RMR and wafer mark WMR are to be imaged superposedly upon the image pickup device CM, the laser light from the laser source LS is used to illuminate these marks. The laser light from the laser source LS is once diffused and averaged by a diffusing plate DP and, thereafter, it is used to illuminate these marks. Denoted at LSH is a shutter which operates, for example, when the X-Y stage XYS is being moved stepwise, to block the laser light from the laser source LS so that it does not impinge on the wafer WF.

Next, the manner of detecting any positional deviation with the structure described above, will be explained. In the following explanation, the right-hand side of the apparatus as it is viewed in the direction of an arrow of FIG. 1 will be called "right" and the left-hand side of the apparatus of FIG. 1 will be called "left".

Figure 4:
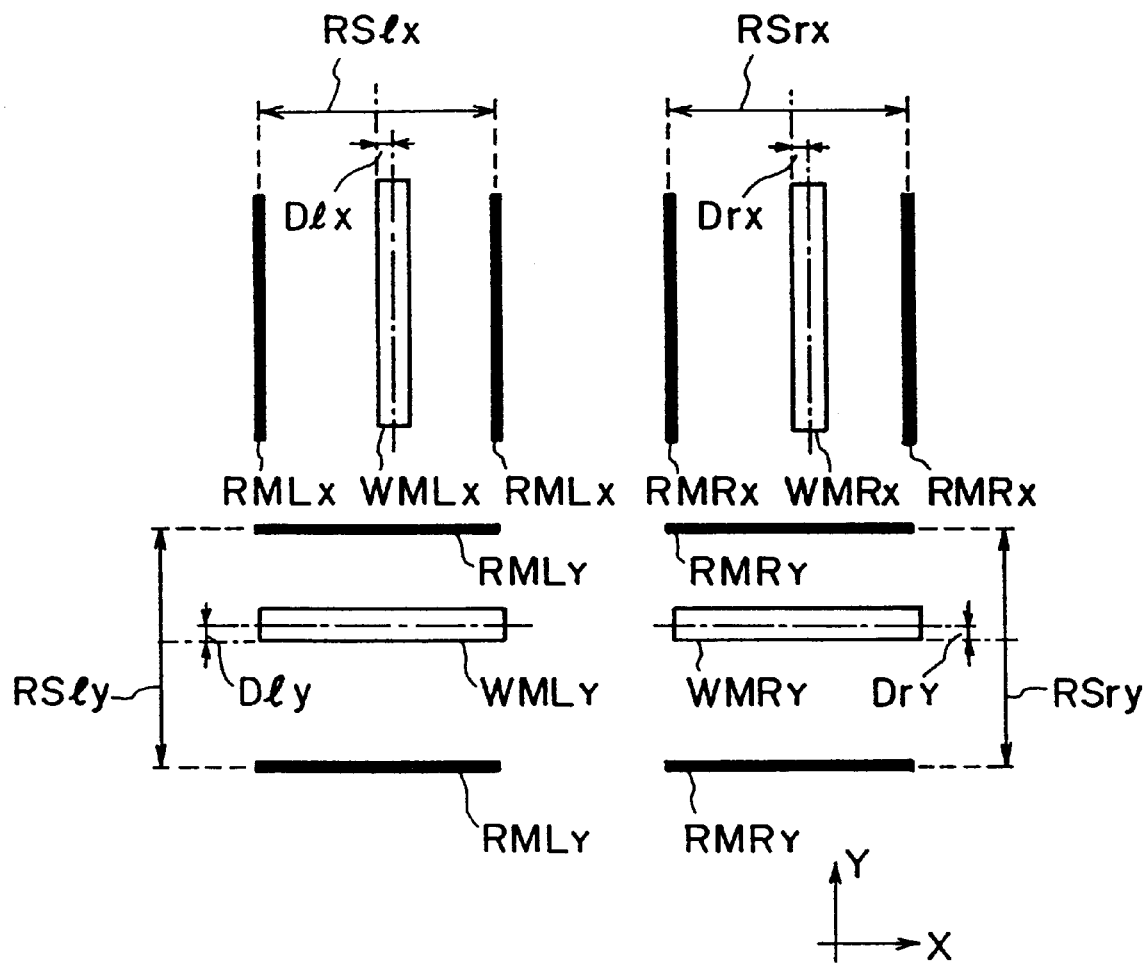
FIG. 4 is a schematic representation, showing the state of marks as imaged on an image pickup surface of an image pickup device.

The laser light emitted from the laser source LS is diffused by the diffusing plate DP and, thereafter, it is scanningly deflected by a polygonal mirror PM. After this, the light is transformed by an f-θ lens Fθ into a constant-speed scanning light which in turn passes through a beam splitter BS and, then, is divided leftwardly and rightwardly by a roof prism DAP. The leftward split laser light is reflected by a right-hand objective mirror AMR so that it is projected onto a zone of the reticle RT including the reticle mark RMR, from above the reticle RT. The laser light passing through the reticle RT goes through the reduction projection lens system LN by which it is projected onto a zone of a particular shot area, including the right-hand wafer mark WMR. Reflection light from the zone including the wafer mark WMR goes backwardly along its oncoming path and, after passing the projection lens system LN and the zone including the reticle mark RNR, it impinges on the roof prism DAP. Similarly, the laser light split rightwardly by the roof prism DAP is reflected by a left-hand objective mirror AML to be projected onto a zone of the reticle including the reticle mark RML and, thereafter, along a similar path, reflection light from a zone of the wafer including the wafer mark WML comes back to the roof prism DAP. The left-hand and right-hand laser lights are combined at the roof prism DAP, and the combined light goes through the beam splitter BS and, after being magnified by an erector EL, it is imaged on the image pickup surface of the image pickup device CM to form images such as shown in FIG. 4. The imaging light from the wafer marks WML and WMR, to be imaged upon the image pickup device, is diffused by the erector EL so that these marks are imaged at an enlarging magnification of ×65. Also, the image pickup device CM comprises a photoelectric converting device such as an ITV camera or a two-dimensional (area) image sensor, for example, and is adapted to convert the received images of the reticle marks RSL and RSR and the wafer marks WML and WMR into two-dimensional electric signals.

FIG. 4 illustrates reticle marks RSL and RSR as well as wafer marks WSL and WSR as imaged upon the image pickup device CM. In this Figure, the reticle marks RML and RMR and the wafer marks WML and WMR, described in the foregoing, are defined in greater detail. Namely, in FIG. 4, the reticle mark RML is depicted by marks $RML_X$ and $RML_Y$; the reticle mark RMR is depicted by marks $RMR_X$ and $RMR_Y$; the wafer marks WML is depicted by marks $WML_X$ and $WML_Y$; and the wafer mark WMR is depicted by marks $WMR_X$ and $WMR_Y$. The left half of FIG. 4 illustrates the images of the left-hand marks $WML_X$ and $WML_Y$ of a shot area SH and the right-hand marks $RML_X$ and $RML_Y$ of the reticle RT, while the right half of FIG. 4 illustrates the images of the right-hand marks $WMR_X$ and $WMR_Y$ of the shot area SH and the images of the left-hand marks $RMR_X$ and $RMR_Y$ of the reticle RT. The reason why the images of the reticle marks $RML_X$, $RML_Y$, $RMR_X$ and $RMR_Y$ are dark, is that the reticle RT is backside-illuminated with the reflection light from the wafer WF and the transmitted light from the reticle is picked up by the image pickup device CM.

The image converted into a two-dimensional electric signal by the image pickup device is digitalized (e.g. binary-coded) by the A/D converting device 21 (FIG. 2) and is stored into an image memory having x-y addresses corresponding to the positions of picture elements of the image pickup surface. The content of the image memorized into the image memory corresponds to that having x addresses (coordinate) designated in the horizontal direction in FIG. 4 and y addresses (coordinate) designated in the vertical direction in FIG. 4.

Deviation measurement is performed with regard to each of the four sets of mark images of FIG. 4, independently of the others. More specifically, from the difference in position on the image surface between the reticle mark $RML_X$ and the wafer mark $WML_X$, the left-hand viewfield deviation $D_{lx}$ in the X direction through the objective mirror AML is detected; similarly from the reticle mark $RML_Y$ and the wafer mark $WML_Y$, the left-hand viewfield deviation $D_{ly}$ in the Y direction is detected; from the reticle marks $RMR_X$ and the wafer mark $WMR_X$, the right-hand viewfield deviation $D_{rx}$ in the X direction through the objective mirror AMR is detected; and from the reticle mark $RMR_Y$ and the wafer mark $WMR_Y$, the right-hand viewfield deviation $D_{ry}$ in the Y direction is detected. Since the measurement of these deviations can be made essentially in the same manner, although the measured values in the X-Y coordinates may be different, description will be made only of an example of the measurement in the left-hand viewfield in the X direction.

Figure 5:
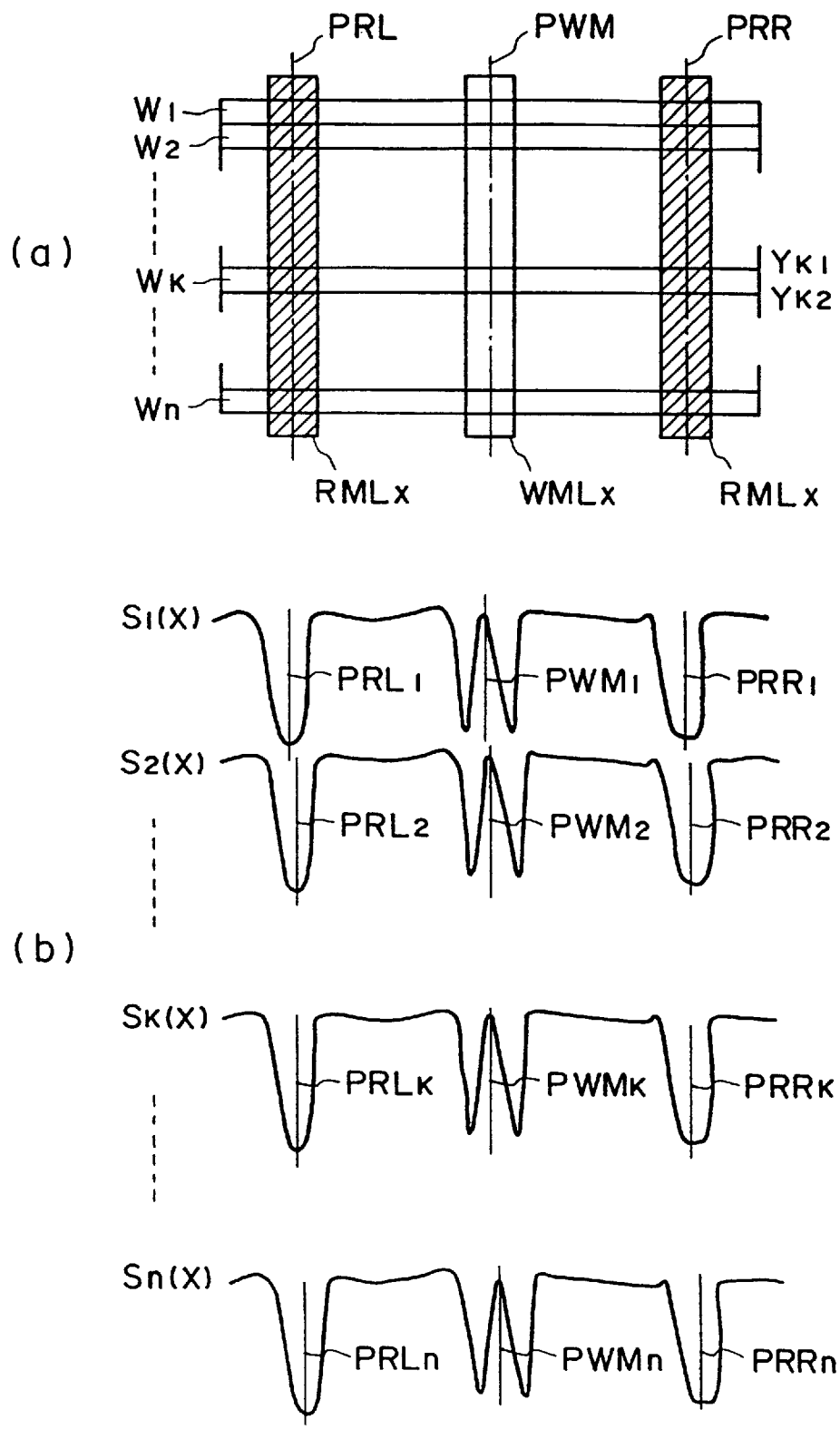
FIG. 5($a$) is a schematic illustration, showing an idealistic mark image.

FIG. 5, part (a) shows the upper left set of marks $RML_X$ and $WML_X$ of FIG. 4. In superposition of the pattern PT of the reticle RT upon the pattern in the shot area SH, the mating marks as described hereinbefore are so designed that the relative positional deviation becomes null when correct pattern superposition can be done. Namely, in FIG. 5(a), if the position of the left mark component of the reticle mark $RML_X$, on the image pickup surface, is denoted by PRL, the position of the right mark component thereof on the image pickup surface is denoted by PRR and the position of the wafer mark $WML_X$ on the image pickup surface is denoted by PWM, then deviation $D_{lx}$ can be expressed by:

$$D_{lx} = PMW - (PRL + PRR)/2$$

Next, description will be made of the method of calculating these positions PRL, PRR and PWM. Reference characters $W_k$ (k=1–n), in FIG. 5, part (a), denote two-dimensional windows set on the image pickup surface. In each of these windows $W_k$, the integrating device 22 shown in FIG. 2 serves to integrate the picture element values from the A/D converting device 21 with respect to a direction (Y direction in this case) perpendicular to the direction (X direction in this case) with respect to which the positional deviation is to be detected. By this, one-dimensional integrated waveforms $S_k(x)$ are provided. When the value of picture element data on the image memory is denoted by P(X,Y) and the range of the window $W_k$ in the Y direction is denoted by $Y_{k1} \leq Y \leq Y_{k2}$, then $S_k(x)$ is expressed as follows:

$$S_k(x) = \sum_{Y=Y_{k1}}^{Y_{k2}} P(X, Y)$$

Actually, as illustrated in FIG. 5(a), windows $W_k$ of a number n are set and, with regard to each window, projected and integrated waveforms such as illustrated in FIG. 5(b), are obtained. In the image as picked up, the edge signal portions of the reticle mark $RML_X$ and the wafer mark $WML_X$ have largely changing contrast as compared with the other portions. As a result, in the integrated waveform $S_k(x)$, the contrast in the direction (X direction) perpendicular to the direction of integration is emphasized and the signal-to-noise ratio (S/N ratio) is enhanced. Accordingly, in these signal portions, a towering peak or a fall is observed.

The position detecting device 23 of FIG. 2 serves to detect the mark positions PRL, PRR and PWM from the above-described integrated waveforms $S_k(x)$. In this position detecting device 23, the same processing is performed to the integrated waveforms $S_1(x)$–$S_n(x)$ of FIG. 5(b). The following explanation will be made of an example of an arbitrary integrated waveform S(x). The mark position detecting operation is divided into a process of detecting the reticle mark positions PRL and PRR and a process of detecting the wafer mark position PWM. Also, each mark detecting process is divided into a process of determining an approximate position and a process of determining an exact position.

For each of the wafer mark position detection and the reticle mark position detection, the approximate position determining process uses a template matching method. First, detection of the position PWM of the wafer mark $WML_X$ will be explained. When an idealistic waveform obtained by the integration is such as depicted at S(x) in part (a) of FIG. 6 and the template is such as at P(x) in part (b) of FIG. 6, then, according to the matching evaluation equation given below, the match degree $E(x_k)$ at an arbitrary point $x_k$ is provided.

$$E(x_k) = \sum_i \{S(x_{i-k}) - P(x_{i-k})\}^2$$

$$i = \{i \mid -b \leq i \leq -a \cap a \leq i \leq b\}$$

Figure 6:
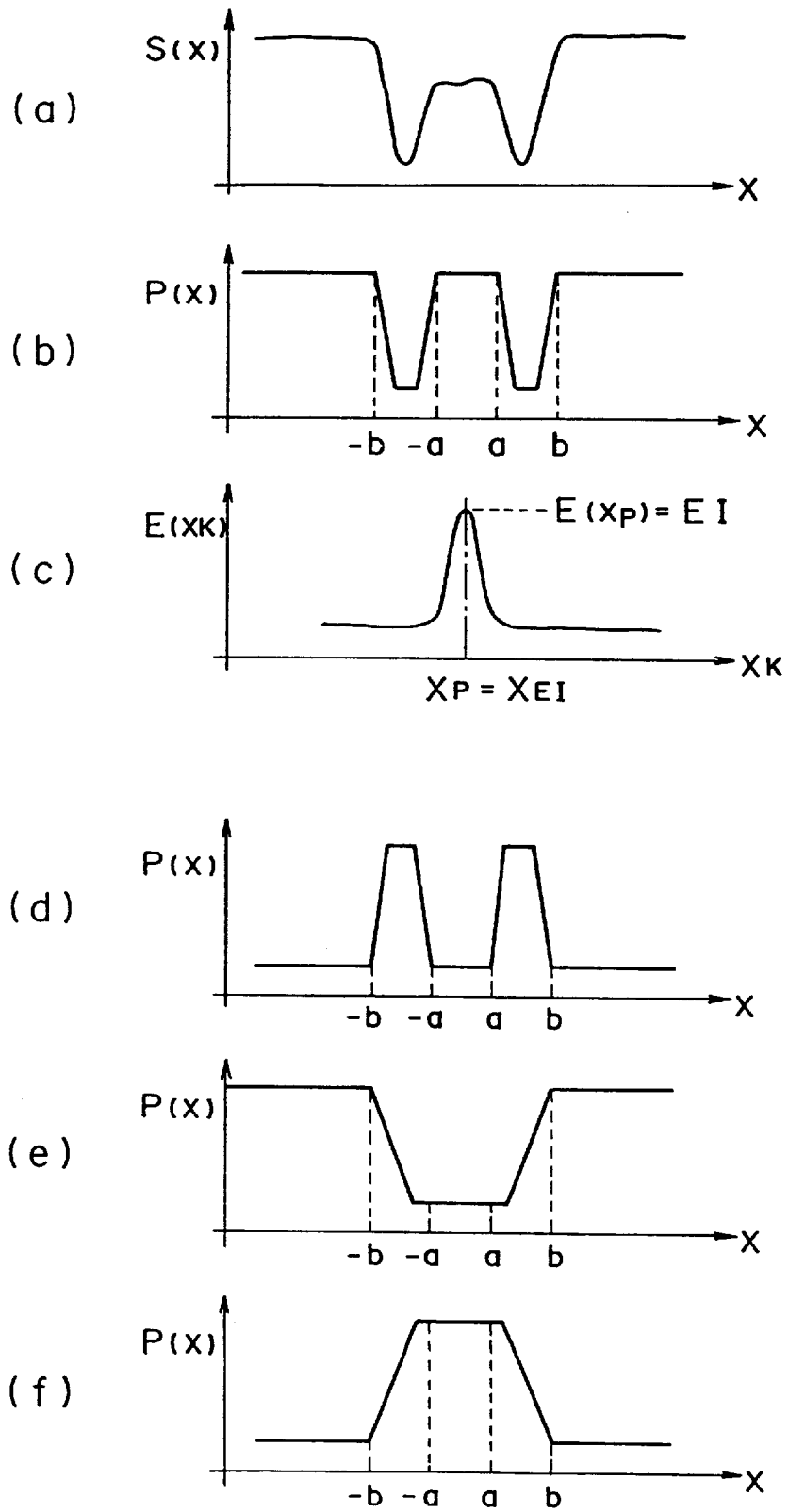
FIGS. 6(a) through 6(f) are schematic representations, showing a template for a mark signal as well as the template match degree.

The parameters $\underline{a}$ and b in the above equation mean the effective range of the template and are used to adjust the characteristics of the template in accordance with the characteristics of S(x). The value of match degree $E(x_k)$ with respect to the arbitrary point $x_k$ has a peak at the approximate position of the wafer mark WML, such as illustrated in FIG. 6(c). The $x_k$ coordinate value at which the match degree $E(x_k)$ shows a peak is denoted by $x_p$, and this peak value is taken as a peak match degree $E(x_p)$. Actually, depending on the semiconductor device manufacturing process or the relationship with the resist film thickness or the like, the integrated waveform is not always such as depicted at S(x). In consideration thereof, actually a few types of templates are used to execute similar processings to calculate corresponding match degrees, and a maximum one of them is adopted. Representative types of templates other than those shown in FIG. 6(b) are illustrated in FIG. 6, (d)–(f). The exact mark position is determined by executing, with regard to the adopted match degree function $E(x_k)$, a gravity center calculation at a few points about the position $x_p$. Alternatively, $E(x_k)$ may be curve-approximated and the exact position may be determined from a peak value of the approximation curve.

Coarse detection of positions PRL and PRR of the mark components of the reticle mark $RML_X$ comprises similar template matching operations. Particularly, by using the fact that the interspacing between two reticle mark components (see FIG. 4) has an approximately constant value, template parameters (–b–a) and (a–b) are set with regular intervals. Precise detection of the positions PRL and PRR is performed by calculating the positions of two reticle mark components, as determined by the template matching, from the center position of the two reticle mark components and, then, by executing gravity center calculation of the integrated waveform S(x) around the approximate position with respect to which the left and right reticle mark components have been calculated.

In this manner, for each of the windows $W_k$, the position detecting device 23 determines the reticle mark positions $PRL_k$ and $PRR_k$ and the wafer mark position $PWM_k$ shown in FIG. 5(b) and, thereafter, for each window $W_k$ it determines the positional deviation $D_{lxk}$ between the reticle mark $RML_X$ and the wafer mark $WML_X$ by computation using the above-described equation. Then, an average of positional deviations $D_{lxk}$ obtained with regard to the respective windows $W_k$ is detected as, in accordance with the equation to be set forth below, the positional deviation $D_{lx}$ between the reticle mark $RML_X$ and the wafer mark $WML_X$. Also, by similar processing, positional deviation $D_{ly}$ is detected from positional deviations $D_{lyk}$ between the reticle mark $RML_Y$ and the wafer mark $WML_Y$ with regard to the respective windows $W_k$; positional deviation $D_{rx}$ is detected from positional deviations $D_{rxk}$ between the reticle mark $RMR_X$ and the wafer mark $WMR_X$ with regard to the respective windows $W_k$; and positional deviation $D_{ry}$ is detected from positional deviations $D_{ryk}$ between the reticle mark $RMR_Y$ and the wafer mark $WMR_Y$ with regard to the respective windows $W_k$.

$$D_{lx} = \frac{1}{n}\sum_{k=1}^{n} D_{lxk}$$

$$D_{ly} = \frac{1}{n}\sum_{k=1}^{n} D_{lyk}$$

$$D_{rx} = \frac{1}{n}\sum_{k=1}^{n} D_{rxk}$$

$$D_{ry} = \frac{1}{n}\sum_{k=1}^{n} D_{ryk}$$

The characteristic parameter extracting device 24 of FIG. 2 serves to obtain an evaluated quantity for the certainty of the detected mark position, namely, for the certainty (reliability) of each of the positional deviations $D_{lx}$, $D_{ly}$, $D_{rx}$ and $D_{ry}$ as determined by the position detecting device 23. More specifically, correspondingly to the detected positional deviations $D_{lx}$, $D_{ly}$, $D_{rx}$ and $D_{ry}$, the characteristic parameter extracting device 24 operates: (1) to detect averages $P_{lx}$, $P_{ly}$, $P_{rx}$ and $P_{ry}$ of the peak match degrees $E_{lxk}(Xp)$, $E_{lyk}(Xp)$, $E_{rxk}(Xp)$ and $E_{ryk}(Xp)$ in the respective windows $W_k$, in accordance with the following equations:

$$P_{lx} = \frac{1}{n}\sum_{k=1}^{n} E_{lxk}(X_p)$$

$$P_{lx} = \frac{1}{n}\sum_{k=1}^{n} E_{lyk}(X_p)$$

$$P_{rx} = \frac{1}{n}\sum_{k=1}^{n} E_{rxk}(X_p)$$

$$P_{rx} = \frac{1}{n}\sum_{k=1}^{n} E_{ryk}(X_p)$$

Also, it operates (2) to detect variances $\sigma_{lx}$, $\sigma_{yl}$, $\sigma_{rx}$ and $\sigma_{ry}$ of the positional deviations $D_{lxk}$, $D_{lyk}$, $D_{rxk}$ and $D_{ryk}$ in the respective windows $W_k$, in accordance with the following equations:

$$\sigma_{lx} = \frac{1}{n-1}\sum_{k=1}^{n} (D_{lxk} - D_{lx})^2$$

$$\sigma_{ly} = \frac{1}{n-1}\sum_{k=1}^{n} (D_{lyk} - D_{ly})^2$$

$$\sigma_{rx} = \frac{1}{n-1}\sum_{k=1}^{n} (D_{rxk} - D_{rx})^2$$

$$\sigma_{ry} = \frac{1}{n-1}\sum_{k=1}^{n} (D_{ryk} - D_{ry})^2$$

Further, it operates (3) to detect errors $\Delta RS_{ilx}$, $\Delta RS_{ily}$, $\Delta RS_{irx}$ and $\Delta RS_{iry}$ between the sample shot areas SSi of the averages $RS_{lx}$, $RS_{ly}$, $RS_{rx}$ and $RS_{ry}$ (see FIG. 4) of the intervals $RS_{lxk}$, $RS_{lyk}$, $RS_{ryk}$ and $RS_{ryk}$ of the reticle mark components for the respective windows $W_k$, in accordance with the following equations:

$$\Delta RS_{ilx} = RS_{ilx} - \frac{1}{n}\sum_{i=1}^{n} RS_{ilx}$$

$$\Delta RS_{ily} = RS_{ily} - \frac{1}{n}\sum_{i=1}^{n} RS_{ilx}$$

$$\Delta RS_{irx} = RS_{irx} - \frac{1}{n}\sum_{i=1}^{n} RS_{irx}$$

$$\Delta RS_{iry} = RS_{iry} - \frac{1}{n}\sum_{i=1}^{n} RS_{iry}$$

wherein i=1–n, and n is the number of sample shot areas selected as the subject of measurement. Each of the intervals $RS_{lxk}$, $RS_{lyk}$, $RS_{rxk}$ and $RS_{ryk}$ is determined by the difference between the positions $PRL_k$ and $PRR_k$ of the reticle mark components in corresponding window $W_k$.

Also, the characteristic parameter extracting device 24 further operates (4) to detect, as evaluated quantities, the shot (chip) magnification errors $\Delta Mag_i$ among the sample shot areas SSi in accordance with the following equation, with a definition that the shot magnification $Mag_i$ of the i-th sample shot area is the difference between the positional deviations $D_{lx}$ and $D_{rx}$ as detected with regard to that shot area:

$$\Delta Mag_i = Mag_i - \frac{1}{n}\sum_{i=1}^{n} Mag_i$$

$$(Mag_i = |D_{ilx} - D_{irx}|)$$

Also, it operates (5) to detect the shot (chip) rotational angle errors $\Delta\theta i$ among the sample shot areas SSi in accordance with the following equation, with a definition that the shot rotational angle $\theta i$ of the i-th sample shot area is the difference between the positional deviations $D_{ly}$ and $D_{ry}$ as detected with regard to that shot area:

$$\Delta\theta_i = \theta_i - \frac{1}{n}\sum_{i=1}^{n} \theta_i$$

$$(\theta_i = |D_{ily} - D_{iry}|)$$

Next, by using the evaluated quantities as set in the above-described items (1)–(5), the characteristic parameter extracting device 24 evaluates the certainty of the positional deviations $D_{ilx}$, $D_{ily}$, $D_{irx}$ and $D_{iry}$ at the sample shot areas SSi detected by the position detecting device 23. Before explaining this, the meaning of the evaluation quantities as set in items (1)–(5) will be explained briefly.

As regards item (1), by way of example, description will be made of a case wherein noise is present on a mark shown in FIGS. 7(a) through 7(c) a case wherein non-uniformness of applied resist is present on a wafer mark shown in FIGS. 8(a) through 8(c) and a case where edges of a wafer mark shown in FIG. 9(a) through 9(c) have asymmetrical taper angles.

Figure 7:
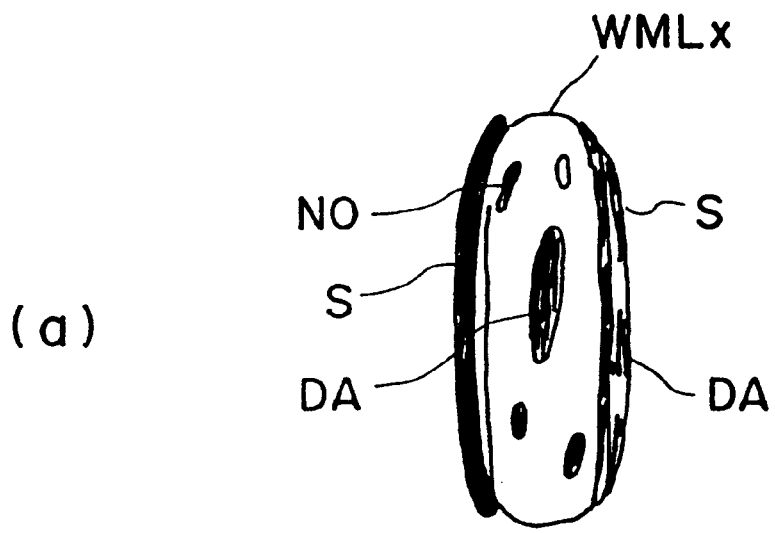
FIGS. 7(a) through 7(c) are schematic representations, showing a mark signal when a mark bears a noise as well as the template match degree in that case.
Figure 7:
Figure 7:
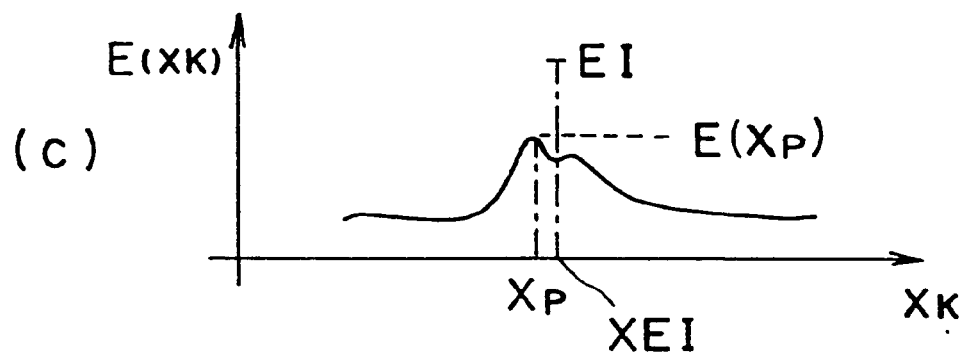

FIG. 7, part (a), shows the wafer mark $WML_X$ as imaged on the image pickup surface of the image pickup device CM. Denoted at DA are noises resulting from foreign particles on the wafer mark $WML_X$, at NO are rough-surface noises produced by the preceding wafer process, and at S are interference fringe noises produced by the interference of laser light from the light source LS. FIG. 7, part (b), shows an integrated waveform S(x) corresponding to the mark, and FIG. 7(c) shows a corresponding peak match degree $E(x_k)$. It is seen from the illustration that, in a case such as shown in FIG. 7(a), the position Xp shown in FIG. 7(c) is deviated from the position XEI as assumed under idealistic conditions such as depicted in FIG. 6, part (c). Also, the peak match degree $E(x_k)$ at that time has two peaks and, additionally, the peak degree $E(x_p)$ is lower than the peak match degree EI as provided under the idealistic conditions shown in FIG. 6(c).

Accordingly, in a case as that of FIG. 7(a), the certainty of the detected mark position is low and the certainty is variable in relation to the peak match degree.

Figure 8:
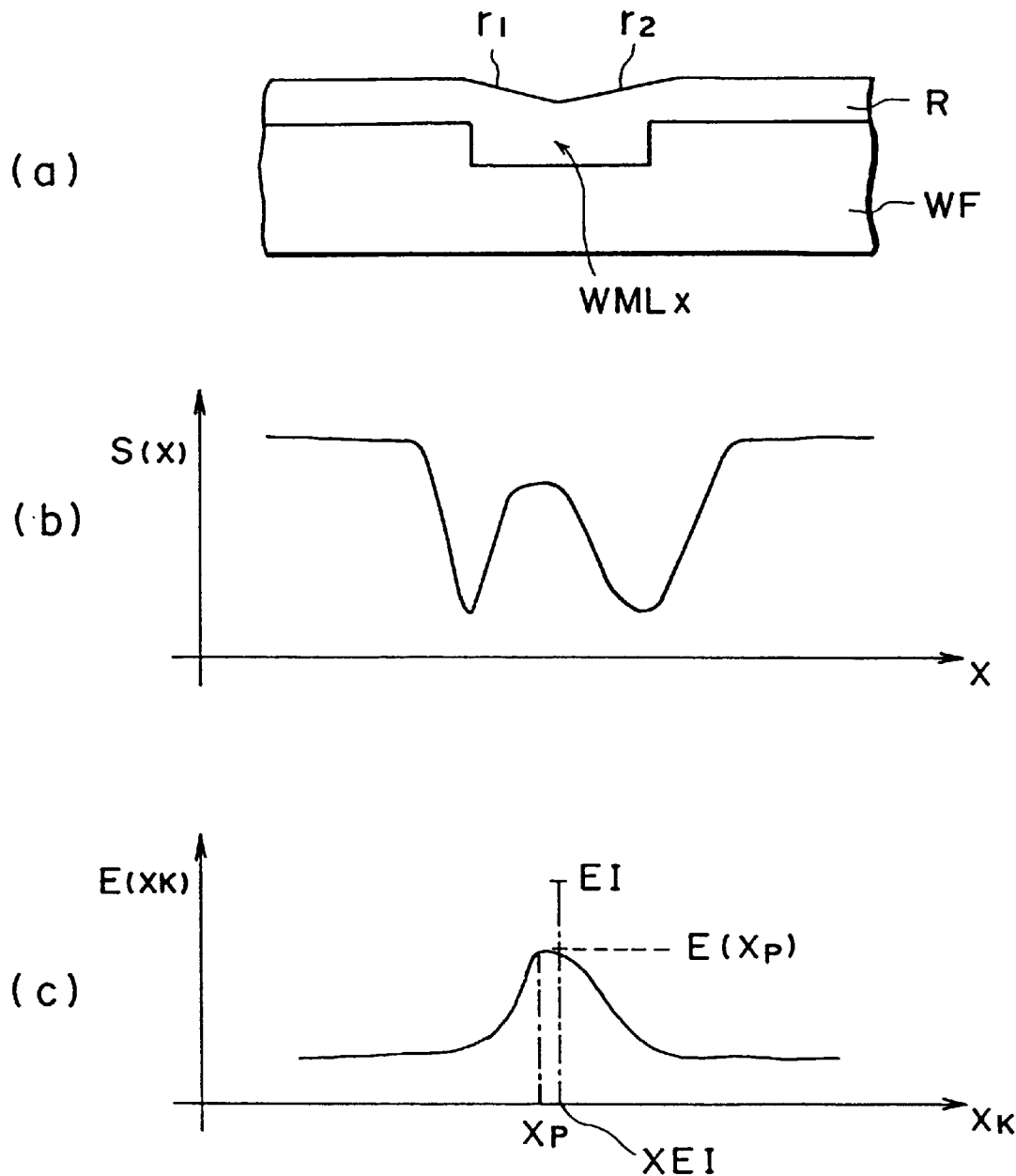
FIGS. 8(a) through 8(c) are schematic representations, showing a mark signal when a mark is covered by a non-uniform resist as well as the template match degree in that case.

FIG. 8, part (a) shows the section of a wafer WF non-uniformness in application of a resist R is present on a wafer mark $WML_X$. In a case such as illustrated, the integrated waveform S(x) to the wafer mark $WML_X$ has a distorted shape such as illustrated in FIG. 8, (b). For such a distorted waveform S(x) and the matching degree $E(x_k)$ of a template P(x) such as shown in part (b) of FIG. 6, there occurs distortion such as shown in FIG. 8, (c). Also, the peak matching degree $E(x_p)$ at this time is lower than the peak matching degree EI as provided under idealistic conditions shown in FIG. 6(c), and the certainty of the position $x_p$ in FIG. 8(c) obtainable therefrom is low. The position $x_p$ in FIG. 8(c) is deviated from the position XEI as assumed under the idealistic conditions shown in FIG. 6(c), due to the distortion of the matching degree $E(x_k)$.

Distortion of the integrated waveform S(x) results from the difference in thickness between the portions r1 and r2 of the resist R. Due to this difference the periodic change in intensity produced by the interference between reflection light from the resist R surface and reflection light from the wafer WF surface, as illuminated by the laser light (alignment light) from the light source LS, differs between the portions r1 and r2. For this reason, the waveform S(x) is asymmetrical. Such non-uniformness in resist application easily occurs when a spinning coater is used wherein a resist R material is dropped onto the surface of a rotating wafer WF so that, with the centrifugal force, the resist R material is applied to the whole surface of the wafer WF. Particularly, such non-uniformness is produced on a mark which is at the outer circumferential part of the wafer WF.

Figure 9:
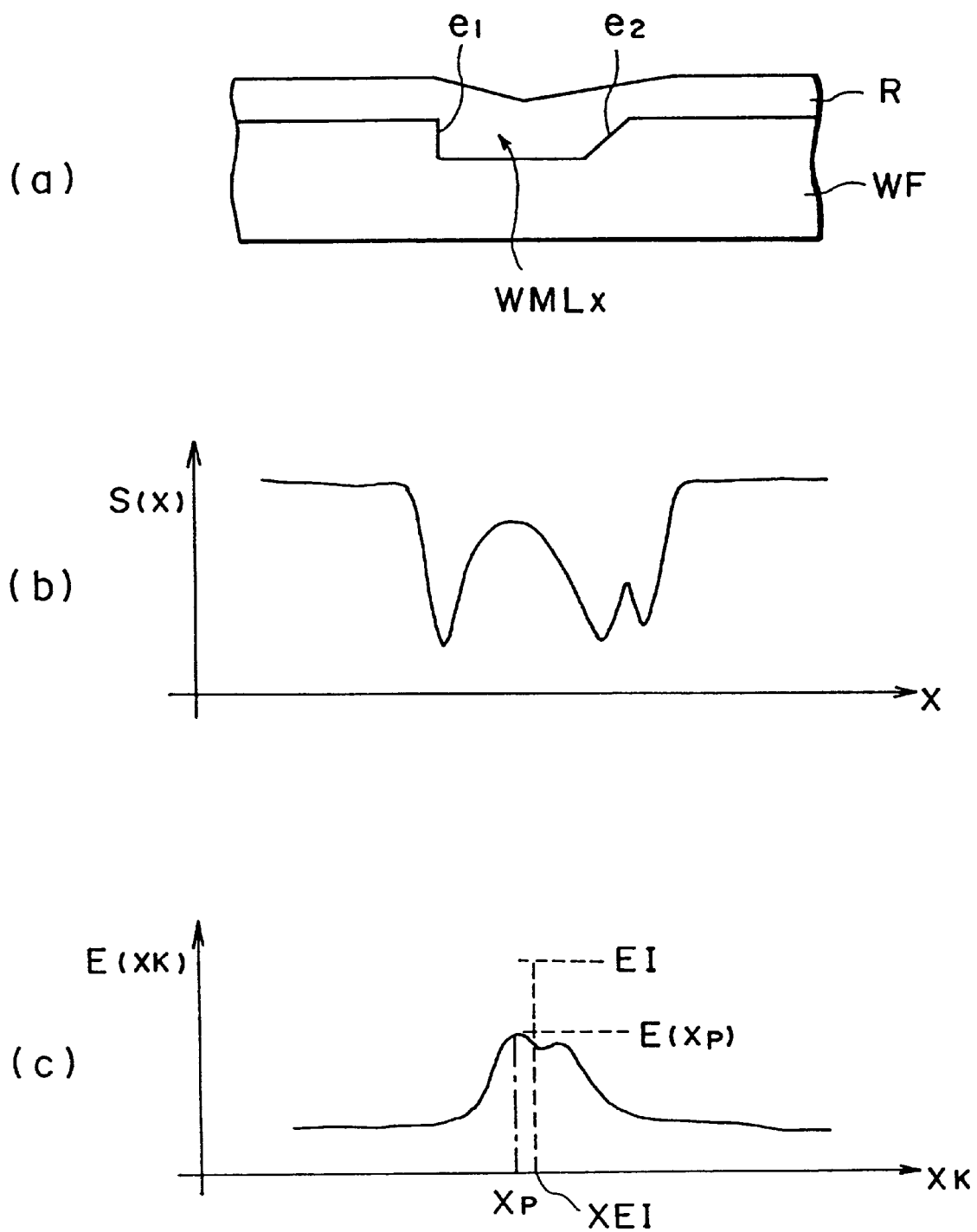
FIGS. 9(a) through 9(c) are schematic representations, showing a mark signal when a mark has asymmetrical edge taper angles as well as the template match degree in that case.

FIG. 9, part (a), shows the section of a wafer WF in a case wherein the edges e1 and e2 of a wafer mark $WML_X$ have asymmetrical taper angles. Also, in this case, the integrated waveform S(x) of the wafer mark $WML_X$ has a deteriorated shape due to distortion and noise, as shown in FIG. 9(b). As a result, the matching degree E(k) with the template P(x) shown in FIG. 6(b) has distortion and two peaks such as shown in FIG. 9(c), and the position $x_p$ is detected with a deviation from the position XEI shown in FIG. 6(c). Also, the peak matching degree $E(x_p)$ at this time is lower than the peak matching degree EI shown in FIG. 6(c) and, therefore, the certainty of the detected position $x_p$ is low. Deterioration of the waveform S(x) is because of the fact that, due to the difference in taper angle (inclination) between the edges e1 and e2 of the wafer WF, non-uniformness arises in the application of the resist R or, alternatively, a difference is produced in the angle of scattering of the alignment light at the edges e1 and e2 which difference results in a difference in intensity of the reflected light.

It will be understood from the foregoing that, by detecting the peak match degrees $P_{ilx}$, $P_{ily}$, $P_{irx}$ and $P_{iry}$ in the manner as described in item (1), it is possible to evaluate the certainty of corresponding positional deviations $D_{ilx}$, $D_{ily}$, $D_{irx}$ and $D_{iry}$.

Figure 10:
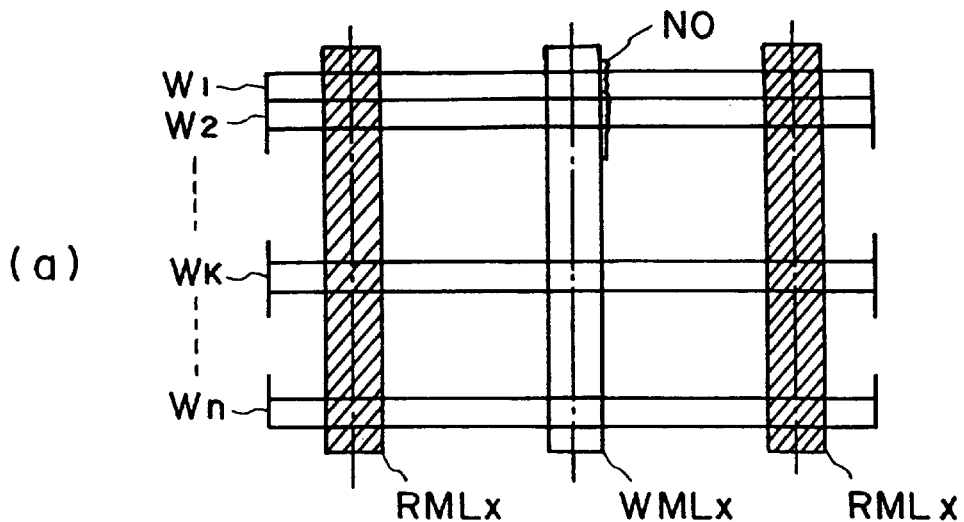
FIGS. 10(a) and 10(b) are schematic representations, showing mark signals when a mark is deformed.
Figure 10:
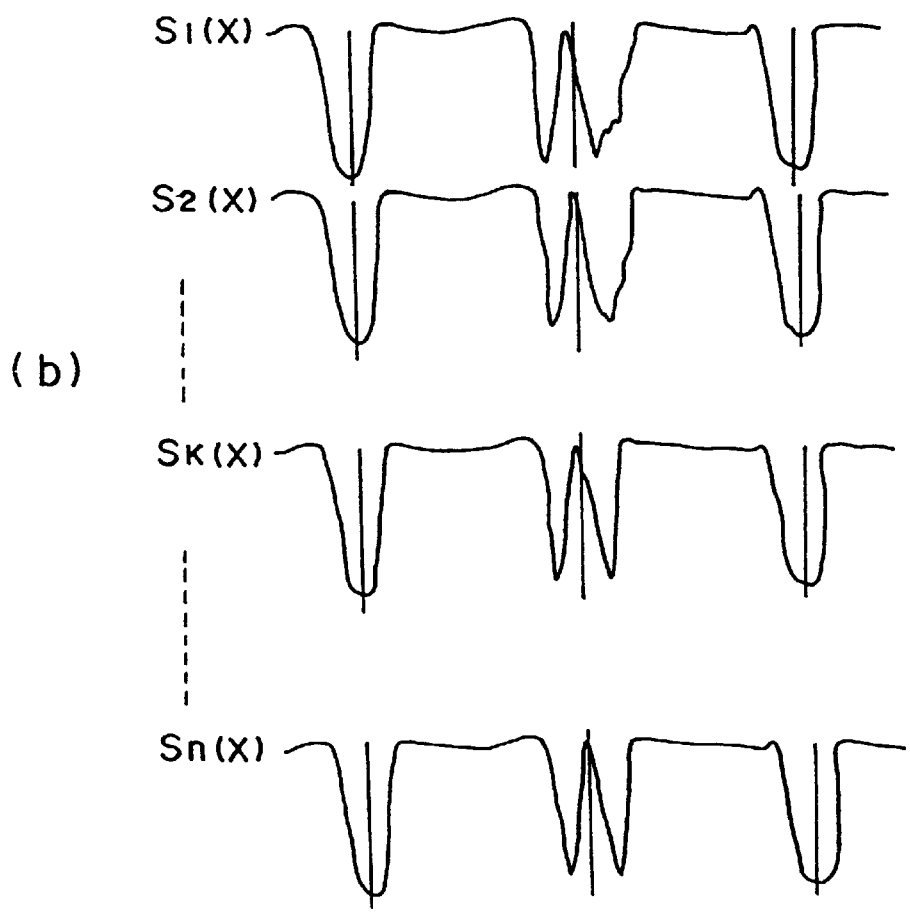
Figure 12:
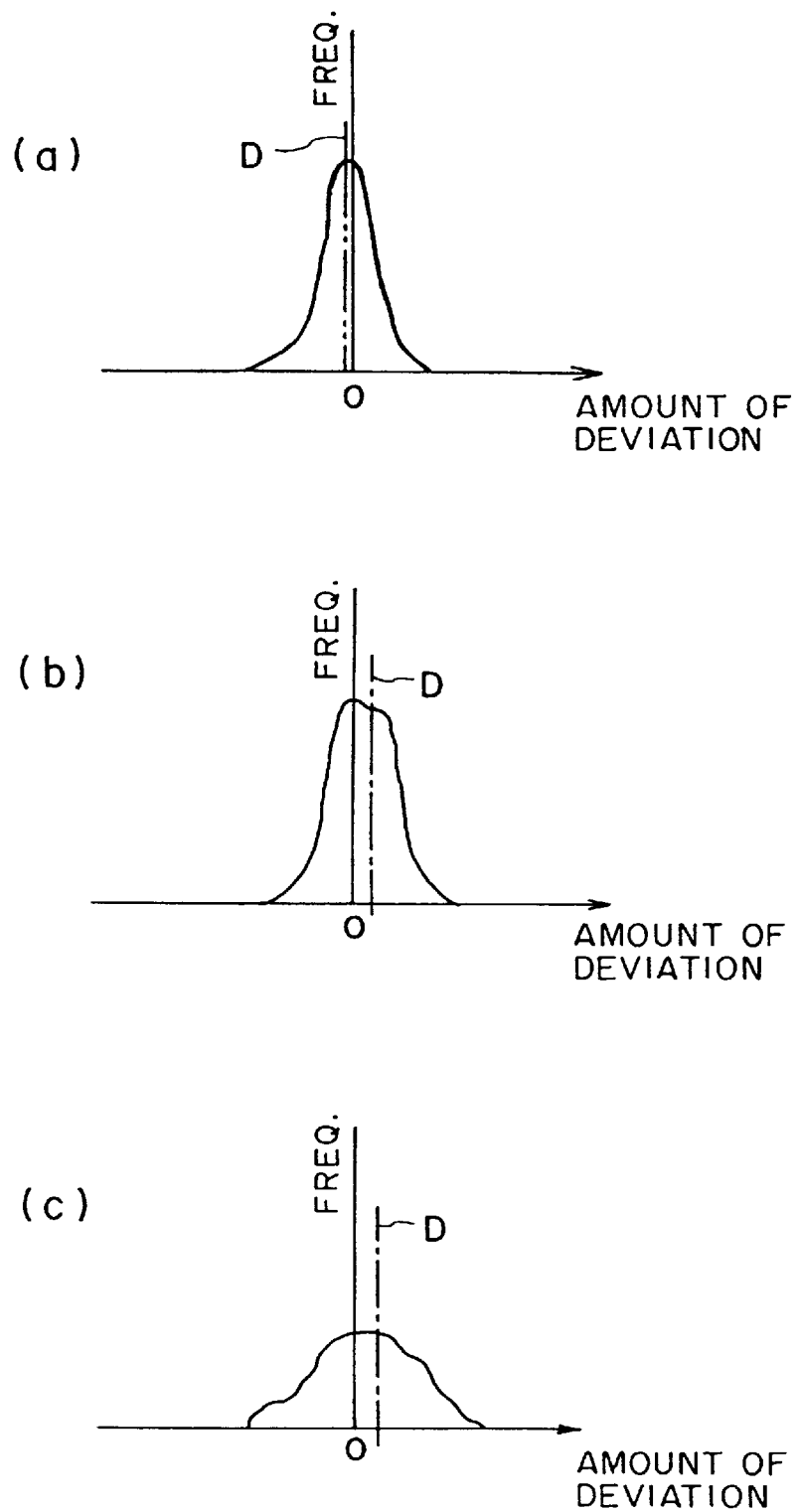
FIGS. 12(a) to 12(c) are schematic representations, showing idealistic mark measurement as well as variance in the measured values of the cases of FIGS. 10(a) and 10(b) and 11(a) and 11(b).

Item (2) will now be explained. Variations $\sigma_{ilx}$, $\sigma_{ily}$, $\sigma_{irx}$ and $\sigma_{iry}$ for the positional deviations $D_{ilx}$, $D_{ily}$, $D_{irx}$ and $D_{iry}$ of the i-th sample shot area SSi, each is a quantity that represents the degree of measurement dispersion, for each window $W_k$, of a deviation with respect to a certain set of measured marks. Clearly, it can be said to be an average of deviations, that is, the quantity that represents the certainty of positional deviation detectable from the mark set. If, for example, a part of a wafer mark $WML_X$ is deformed or local noises NO are present thereon such as shown in FIG. 10(a), the integrated waveform $S_k(x)$ of each window $W_k$ is locally deformed such as shown in FIG. 10(b), whereby the deviation of the detected mark position D from the true position O is large. In such a case, the histogram of deviation in each window $W_k$ has an expanded distribution, as shown in FIG. 12(b), as compared with the histogram of deviation obtainable from a set of marks placed under idealistic conditions as shown in FIG. 12(a). Therefore, the variance becomes large and the deviation of the detected position D from the true position O becomes large.

Figure 11:
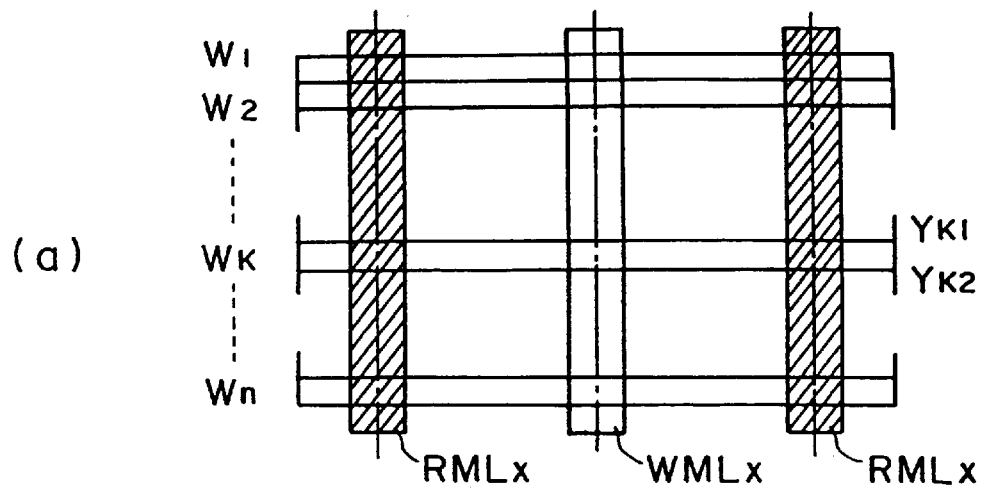
FIGS. 11(a) and 11(b) are schematic representations, showing mark signals when the intensity of mark illuminating light is weak.
Figure 11:
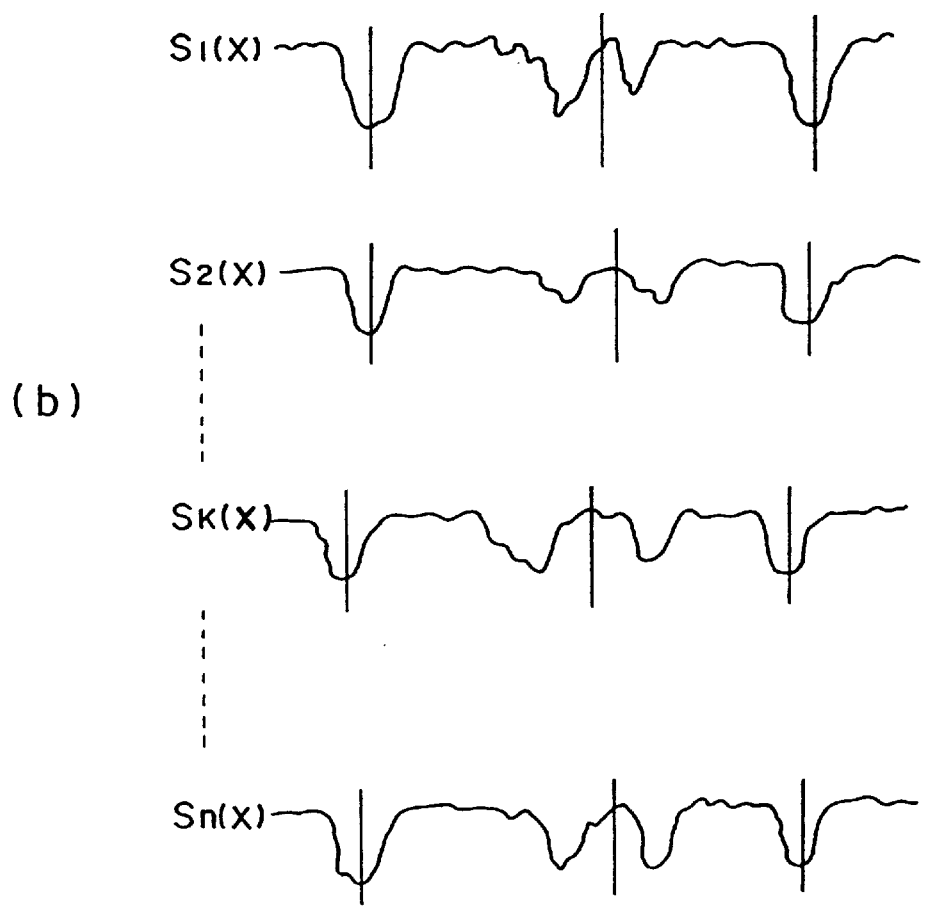

Also, in the case of a good-condition mark set shown in FIG. 11, part (a), if a sufficient S/N ratio is not obtainable because of an insufficient quantity of alignment light from the light source LS, for example, its integrated waveform $S_k(x)$ is influenced by random noise such as shown in FIG. 11(b) and, therefore, there is a tendency that the mark position detectable from the integrated waveform $S_k(x)$ contains large measurement dispersion as shown in FIG. 12(c) and, consequently, the variance of positional deviation becomes large. Also, it is seen that, because a sufficient number n of samples of the window $W_k$ cannot be used, the average of the detected positions contains an error larger than that of the average of the detected positions for good-condition marks. Thus, in such case there is a tendency that the detected mark position D is largely displaced from the true position O and the certainty of the detected deviation is small.

Figure 13A:
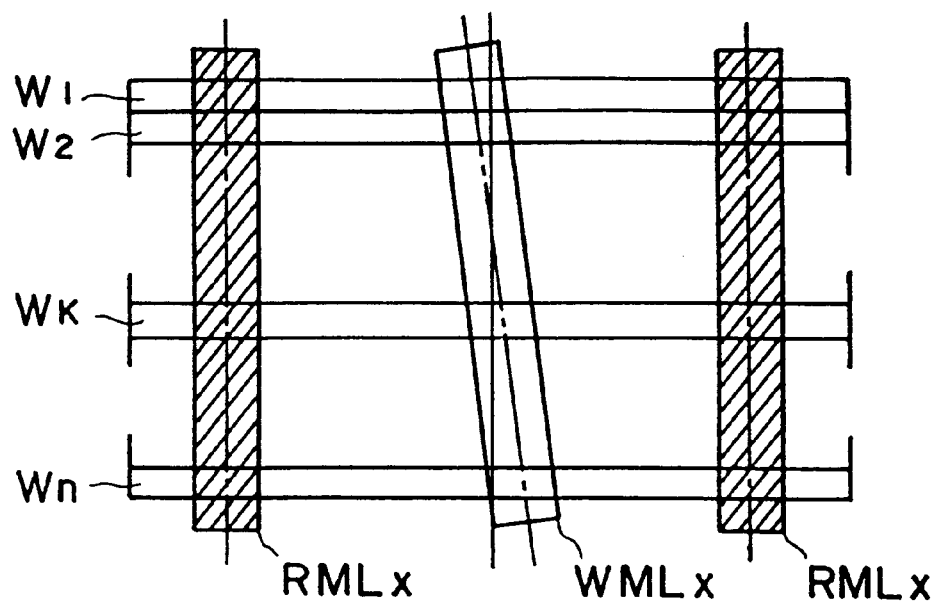
FIGS. 13A and 13B are schematic representations, showing the manner of variation in the measured positional deviation on an occasion when a mark is rotated.
Figure 13B:
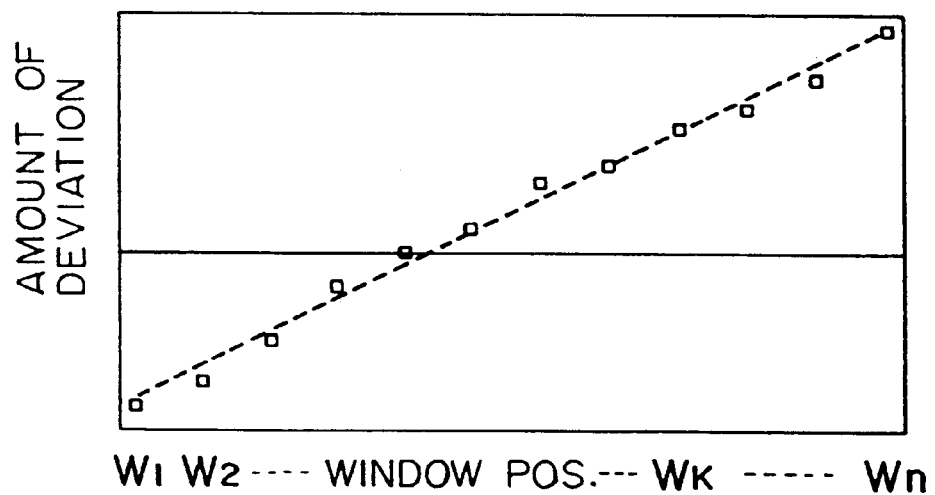

Further, in a case when the rotational angle θ between the shot area SH and the reticle RT is large and the wafer mark $WML_X$ is largely inclined relative to the reticle mark $RML_X$ such as shown in FIG. 13A, the amount of deviation is dependent upon the position of the window $W_k$ as illustrated in FIG. 13B and the variance is large even if the conditions of the marks are good. It is to be noted that, in place of variance, the windows $W_k$ may be defined at regular intervals and a least square error when the amount of deviation relative to the window $W_k$ position is rectilinearly approximated, may be detected. On that occasion, by using a known method of regression analysis such as, for example, the method discussed in "Statistic Analysis", Taguchi and Yokoyama, Japanese Standards Association, "Chapter 3, 3.4 Formula of Regression Analysis and its Induction", the least square error min(Se) can be expressed in the following manner:

When the window position is x and the deviation is y, first the values of m and b in the following equation are determined so as to minimize the remaining square sum Se which is represented by:

$$Se \equiv \sum_{i=1}^{n} [y_i - m - b(x_i - \bar{x})]^2$$

thus,

-continued $$\min(Se) = \sum_{i=1}^{n}(y_i - \bar{y})^2 - \frac{\left[\sum_{i=1}^{n}(x_i - \bar{x})(y_i - \bar{y})\right]^2}{\sum_{i=1}^{n}(x_i - \bar{x})^2}$$

Next, item (3) will be explained. The interval of the reticle mark components is the quantity as determined by the set value of the reticle mark, and it is clear that the variation in its measured values $RS_{lx}$, $RS_{ly}$, $RS_{rx}$ and $RS_{ry}$ for different sample shot areas is influenced by any variation in measurement or by those elements that reduce the certainty of measurement, such as variation in optical magnification, for example. Therefore, errors $\Delta RS_{ilx}$, $\Delta RS_{ily}$, $\Delta RS_{irx}$ and $\Delta RS_{iry}$ in the reticle mark interval of all the sample shot areas SSi, selected as the subject of measurement, with reference to an average reticle mark interval of all the sample shot areas, also reflect the certainty of measurement.

With regard to items (4) and (5), clearly the shot magnification error $\Delta Mag_i$ and the shot rotational angle error $\Delta\theta i$ of each sample shot area SSi selected as the subject of measurement, have a relation with the certainty of the detected mark position of that shot area. If the shot magnification error and the shot rotational angle error are large, the certainty of the detected mark position of that shot area is low.

Referring back to the characteristic parameter extracting device 24, after calculation of the evaluating quantities having been described with reference to items (1)–(5), for each sample shot area SSi the characteristic parameter extracting device 24 determines the certainty (characteristic parameter) $W_{ix}$ and $W_{iy}$ of the detected positional deviation $D_{ix}$ and $D_{iy}$ from these evaluating quantities, on the basis of the fuzzy reasoning. Here, $$D_{ix} = \frac{1}{2}(D_{ilx} + D_{irx})$$

$$D_{iy} = \frac{1}{2}(D_{ily} + D_{iry})$$

With respect to the detected positional deviations (detected mark positions) of the evaluating quantities discussed in items (1)–(5), fourteen (14) types of conditional propositions (Pj→Qj) are set in the characteristic parameter extracting device 24 in the form of fuzzy reasoning, wherein Pj is an antecedent proposition and Qj is a consequent proposition.

The conditional propositions (P1→Q1) to (P4→Q4) are concerned with the averages $P_{lx}$, $P_{ly}$, $P_{rx}$ and $P_{ry}$ of the peak match degrees (hereinafter, each average will be referred to as "peak match degree") as discussed in item (1). More specifically:

1. The conditional proposition (P1→Q1) is such that, in the i-th sample shot area, (P1) if the peak match degree $P_{ilx}$ is low, (Q1) the certainty $W_{i1}$ of the detected positional position deviation $D_{ilx}$ is low.

2. The conditional proposition (P2→Q2) is such that, in the i-th sample shot area, (P2) if the peak match degree $P_{ily}$ is low, (Q2) the certainty $W_{i2}$ of the detected positional deviation $D_{ily}$ is low.

3. The conditional proposition (P3→Q3) is such that, in the i-th sample shot area, (P3) if the peak match degree $P_{irx}$ is low, (Q3) the certainty $W_{i3}$ of the detected positional deviation $D_{irx}$ is low.

4. The conditional proposition (P4→Q4) is such that, in the i-th sample shot area, (P4) if the peak match degree $P_{iry}$ is low, (Q4) the certainty $W_{i4}$ of the detected positional deviation $D_{iry}$ is low.

On the other hand, the conditional propositions (P5→Q5) to (P8→Q8) are concerned with the variances $\sigma_{lx}$, $\sigma_{ly}$, $\sigma_{rx}$ and $\sigma_{ry}$ discussed in item (2). More specifically:

5. The conditional proposition (P5→Q5) is such that, in the i-th sample shot area, (P5) if the variance $\sigma_{ilx}$ is large, (Q5) the certainty $W_{i5}$ of the detected positional deviation $D_{ilx}$ is low.

6. The conditional proposition (P6→Q6) is such that, in the i-th sample shot area, (P6) if the variance $\sigma_{ily}$ is large, (Q6) the certainty $W_{i6}$ of the detected positional deviation $D_{ily}$ is low.

7. The conditional proposition (P7→Q7) is such that, in the i-th sample shot area, (P7) if the variance $\sigma_{irx}$ is large, (Q7) the certainty $W_{i7}$ of the detected positional deviation $D_{irx}$ is low.

8. The conditional proposition (P8→Q8) is such that, in the i-th sample shot area, (P8) if the variance $\sigma_{iry}$ is large, (Q8) the certainty $W_{i8}$ of the detected positional deviation $D_{iry}$ is low.

Further, the conditional propositions (P9→Q9) to (P12–Q12) are those related to the reticle mark deviations $\Delta RS_{ilx}$, $\Delta RS_{ily}$, $\Delta RS_{irx}$ and $\Delta RS_{iry}$ discussed in item (3). More specifically:

9. The conditional proposition (P9→Q9) is such that, in the i-th sample shot area, (P9) if the reticle mark deviation $\Delta RS_{ilx}$ is not equal to zero (=0), (Q9) the certainty $W_{i9}$ of the detected positional deviation $D_{ilx}$ is low.

10. The conditional proposition (P10→Q10) is such that, in the i-th sample shot area, (P10) if the reticle mark deviation $\Delta RS_{ily}$ is not equal to zero (=0), (Q10) the certainty $W_{i10}$ of the detected positional deviation $D_{ily}$ is low.

11. The conditional proposition (P11→Q11) is such that, in the i-th sample shot area, (P11) if the reticle mark deviation $\Delta RS_{irx}$ is not equal to zero (=0), (Q11) the certainty $W_{i11}$ of the detected positional deviation $D_{irx}$ is low.

12. The conditional proposition (P12→Q12) is such that, in the i-th sample shot area, (P12) if the reticle mark deviation $\Delta RS_{iry}$ is not equal to zero (=0), (Q12) the certainty $W_{i12}$ of the detected positional deviation $D_{iry}$ is low.

Also, the conditional propositions (P13→Q13) and (P14→Q14) relate to the shot magnification error $\Delta Mag_i$ and the shot rotational angle error $\Delta\theta i$, respectively, discussed in items (4) and (5). More specifically:

13. The conditional proposition (P13→Q13) is such that, in the i-th sample shot ares, (P13) if the shot magnification error $\Delta Mag_i$ is not equal to zero (=0), (Q13) the certainty $W_{i13}$ of the detected positional deviations $D_{ix}$ and $D_{iy}$ is low.

14. The conditional proposition (P14→Q14) is such that, in the i-th sample shot area, (P14) if the shot rotational angle error $\Delta\theta i$ is not equal to zero (=0), (Q14) the certainty $W_{i14}$ of the detected positional deviations $D_{ix}$ and $D_{iy}$ is low.

By using linguistic truth values related to the fuzzy reasoning, the conditional proposition (P1→Q1), for example, of the above-described conditional propositions (Pj–Qj), can be expressed as follows:

(A) if $P_{ilx}$ is BG then $W_{i1}$ is GD.

(B) if $P_{ilx}$ is MD then $W_{i1}$ is UK.

(C) if $P_{ilx}$ is SM then $W_{i1}$ is NG.

Here, the abbreviations "BG", "MD" and "SM" correspond to the linguistic truth values of the antecedent propositions, respectively, and they are fuzzy sets which mean "big", "middle" and "small", respectively. Also, the abbreviations "GD", "UK" and "NG" correspond to the linguistic truth values of the consequent propositions, respectively, and they are fuzzy sets which mean "good", "unknown" and "no good", respectively. Further, while not described in detail, the conditional propositions (P2→Q2), (P3→Q3) and (P4→Q4) can be expressed similarly by using the linguistic truth values.

Also, the conditional proposition (P5→Q5) can be expressed by using the linguistic truth values related to the fuzzy reasoning, in the following manner:

(A) if $\sigma_{iIx}$ is SM then $W_{i5}$ is GD.
(B) if $\sigma_{iIx}$ is MD then $W_{i5}$ is UK.
(C) if $\sigma_{iIx}$ is BG then $W_{i5}$ is NG.

Similarly, the abbreviations "BG", "MD" and "SM" correspond to the linguistic truth values of the antecedent propositions, respectively, and they are fuzzy sets which mean "big", "middle" and "small", respectively. Also, the abbreviations "GD", "UK" and "NG" correspond to the linguistic truth values of the consequent propositions, respectively, and they are fuzzy sets which mean "good", "unknown" and "no good", respectively. Further, while not described in detail, the conditional propositions (P6→Q6), (P7→Q7) and (P8→Q8) can be expressed similarly by using the linguistic truth values.

Further, by using the linguistic truth values related to the fuzzy reasoning, the conditional proposition (P9→Q9) can be expressed as follows:

(A) if $\Delta RS_{iIx}$ is NB then $W_{i9}$ is NG.
(B) if $\Delta RS_{iIx}$ is NS then $W_{i9}$ is UK.
(C) if $\Delta RS_{iIx}$ is ZE then $W_{i9}$ is GD.
(D) if $\Delta RS_{iIx}$ is PS then $W_{i9}$ is UK.
(E) if $\Delta RS_{iIx}$ is PB then $W_{i9}$ is NG.

Here, the abbreviations "NB", "NS", "ZE", "PS" and "PB" correspond to the linguistic truth values of the antecedent propositions, respectively, and they are the fuzzy sets which mean "negative big", "negative small", "zero", "positive small" and "positive big". Also, the abbreviations "GD", "UK" and "NG" correspond to the linguistic truth values of the consequent propositions, respectively, and they are the fuzzy sets which mean "good", "unknown" and "no good". Further, while not described in detail, the conditional propositions (P10→Q10), (P11→Q11), (P12→Q12), (P13→Q13) and (P14→Q14) can be expressed in a similar manner, by using the linguistic truth values.

The respective fuzzy sets of the linguistic truth values (SM, MD and BG), (NB, NS, ZE, PS and PB) (GD, UK and NG) of the conditional propositions (Pj→Qj) are determined as different sets, in accordance with empirical rules of each conditional proposition (Pj→Qj), and they are set into a memory of the characteristic parameter extracting device 24 in the form of membership functions, by an operator and through the console CS (FIG. 1).

Also, in response to instructions by the operator from the console CS, the characteristic parameter extracting device 24 operates to make a selection for the conditional propositions (Pj→Qj) to be used to determine the certainty $W_{ix}$ and $W_{iy}$ of the detected positional deviation $D_{ix}$ and $D_{iy}$ of the i-th sample shot area SSi. For example, the characteristic parameter extracting device 24 selects all the conditional propositions (Pj→Qj) or a part of these conditional propositions, for determination of the certainty $W_{ix}$ and $W_{iy}$. While such selection is determined by the operator beforehand, different selections may be made for different sample shot areas SSi, different wafers WF or different lots of wafers WF, depending on the position of each sample shot area SSi of each wafer WF, the shape of each mark, the type or state of each resist applied.

Next, the manner of determining the certainty $W_{ix}$ and $W_{iy}$ by the characteristic parameter extracting device 24 will be explained, with reference to an example wherein all the conditional propositions (Pj→Qj) described above are used. Here, if the consequent propositions of the certainty $W_{ix}$ and $W_{iy}$ (determined or defined value which is not a fuzzy numeral but a crisp value) of the detected positional deviation $D_{ix}$ and $D_{iy}$ of the i-th sample shot area SSi are denoted by $Q_{ix}$ and $Q_{iy}$ (fuzzy sets), then for each sample shot area SSi the characteristic parameter extracting device 24 performs the fuzzy reasoning based on the V-operation so as to provide:

$(P_1 \vee P_2 \vee P_5 \vee P_6 \vee P_9 \vee P_{10} \vee P_{13} \vee P_{14}) \rightarrow Q_{ix}$
$(P_3 \vee P_4 \vee P_7 \vee P_8 \vee P_{11} \vee P_{12} \vee P_{13} \vee P_{14}) \rightarrow Q_{iy}$ Namely, $Q_{ix} = (Q_1 \vee Q_2 \vee Q_5 \vee Q_6 \vee Q_9 \vee Q_{10} \vee Q_{13} \vee Q_{14})$
$Q_{iy} = (Q_3 \vee Q_4 \vee Q_7 \vee Q_8 \vee Q_{11} \vee Q_{12} \vee Q_{13} \vee Q_{14})$ Since the V-operation in the fuzzy set shows the MAX-operation (if, of two numerals a and b, a>b, then MAX {a, b}=a), the above equations can be rewritten as follows:

$Q_{ix} = \text{MAX}(Q_1, Q_2, Q_5, Q_6, Q_9, Q_{10}, Q_{13}, Q_{14})$
$Q_{iy} = \text{MAX}(Q_3, Q_4, Q_7, Q_8, Q_{11}, Q_{12}, Q_{13}, Q_{14})$ Subsequently, the characteristic parameter extracting device 24 operates to quantify the fuzzy sets $Q_{ix}$ and $Q_{iy}$ into the defined values of certainty $W_{ix}$ and $W_{iy}$. This quantification can be made by calculating the gravity center of the membership functions of the fuzzy sets $Q_{ix}$ and $Q_{iy}$.

That is, by taking $Q_{ix}$ as the value on the coordinate $q_x$ and by taking the membership function as $Q_{ix}=f(qx)$, the certainty is calculated by:

$$W_{ix} = \frac{\int f(qx) \cdot qx \, dqx}{\int f(qx) dqx}$$

Similarly, by taking $Q_{iy}$ as the value on the coordinate qy and by taking the membership function as $Q_{iy}=f(qy)$, the certainty is calculated by:

$$W_{iy} = \frac{\int f(qy) \cdot qy \, dqy}{\int f(qy) dqy}$$

Then, the characteristic parameter extracting device 24 outputs the defined values of certainty $W_{ix}$ and $W_{iy}$, as the characteristic parameters.

It is to be noted here that, if the defined values of the certainty $W_{ix}$ and $W_{iy}$ are very small as compared with a certain preset value and thus they are not effective, the characteristic parameter extracting device 24 produces a zero output in place of the defined values, to thereby avoid that the positional deviations $D_{ix}$ and $D_{iy}$ corresponding to that certainty are influential to the preparation of a corrected grid to be described later. In other words, it determines the certainty $W_{ix}$ and $W_{iy}$ so as to allow rejection of what can be called "extraordinary values" during the subsequent computation for determining the corrective grid. However, this is not limiting but may be modified in response to instructions given by the operator beforehand, from the console CS. Also, it is possible to change the preset value.

Next, the sequence of an alignment operation in this embodiment will be explained with reference to the flow chart of FIG. 14.

Step S01

First, the reticle RT is introduced onto the reticle stage RS by means of a conveying hand mechanism (not shown), and the reticle is fixedly held on the reticle stage by vacuum attraction. After this, the objective mirrors AML and AMR are moved to the positions just above the reticle setting marks RSML and RSMR, respectively, which are in a predetermined positional relationship with the projection lens LN. Then, superposed images of the reticle setting mark RSML (RSMR) and the reticle alignment mark RAML (RAMR) provided on the reticle RT, are picked up by the image pickup device CM. The control unit CU processes the image data (video signal) from the image pickup device CM and calculates the relative positional deviation, i.e., the positional deviation of the reticle RT with respect to the projection lens LN. Then, the control unit CU controllably moves the reticle stage RS in the X, Y and/or θ direction to reduce the positional deviation to zero. By this, the reticle RT can be brought into a predetermined positional relationship with the projection lens LN.

Step S02

Then, the wafer WF is introduced onto the wafer stage WS by means of a conveying hand mechanism (not shown), and the wafer is fixedly held on the wafer stage by vacuum attraction. Since the wafer has been prealigned, the disposition of the shot areas SH thereon when the wafer is introduced onto the wafer stage WS is approximately in a parallel relationship with the X and Y directions in the X-Y coordinates. Also, the center of the wafer is approximately coincident with the center of the wafer stage WS. The design disposition data of the shot areas SH as well as the position data of the wafer alignment marks WAML and WAMR have been memorized into a memory of the control unit CU, from the console CS. Thus, the control unit CU can control the movement of the X-Y stage XYS in the X and Y directions on the basis of the positional data of the X-Y stage in the X and Y directions as measured through the laser interferometers IFX and IFY, by which each shot area SH of the wafer WF can be approximately positioned below the projection lens LN and, also, each of the wafer alignment marks WAML and WAMR can be approximately positioned below the off-axis scope OS.

The operation to be performed at Steps S03 and S04 is an operation for aligning the wafer WF as a whole with a relatively low precision. This is a preliminary operation to the high-precision alignment measurement to be made at Steps S05–S12 and can be omitted provided that the pre-alignment operation has a sufficient precision. Generally, however, it is necessary.

Step S03

First, on the basis of the positional data of the X-Y stage XYS measured through the interferometers IFS and IFY as well as the design positional data of the wafer alignment mark WAML, the control unit CU controls the movement of the X-Y stage XYS in the X and Y directions so that the wafer alignment mark WAML comes to the position just below the off-axis scope OS. Then, an image of the wafer alignment mark WAML is picked up through the off-axis scope OS. The position of the thus picked-up image of the wafer alignment mark WAML is displaced from the center of the image-taking picture plane of the off-axis scope OS by an amount corresponding to the inaccurateness of the wafer WF placement with respect to the wafer stage WS. From the image data produced by the off-axis scope OS, the control unit CU calculates the amount of such displacement (deviation) and memorizes it into the memory thereof.

Subsequently, through similar movement of the X-Y stage XYS, the other wafer alignment mark WAMR is positioned just below the off-axis scope OS, and the image thereof is picked up through the off-axis scope OS. Any positional deviation thereof is calculated and recorded by the control unit CU.

Step S04

From the obtained positional deviations of the wafer alignment marks WAML and WAMR, measured at step S03, deviations of the wafer WF from its design position with respect to the X, Y and θ directions are calculated. The deviation in the θ direction (rotational error) is corrected by rotationally moving the wafer stage WS in the θ direction. The deviation in the X direction is recorded as a shift component variable Sx while the deviation in the Y direction is recorded as a shift component variable Sy. Also, at this time, the magnification component variables βx and βy in the X and Y directions as well as the rotational component variables θx and θy are all initialized to zero.

These variables Sx, Sy, βx, βy, θx and θy are used at Steps S07 and S09 (to be described) for determination of corrective values (corrected grating) to the design disposition data of the shot areas SH. Hereinafter, they are also used in a combined form of components of vectors A and S, such as follows:

$$A = \begin{bmatrix} \beta x & \theta y \\ \theta x & \beta y \end{bmatrix} \quad S = \begin{bmatrix} Sx \\ Sy \end{bmatrix}$$

Figure 3:
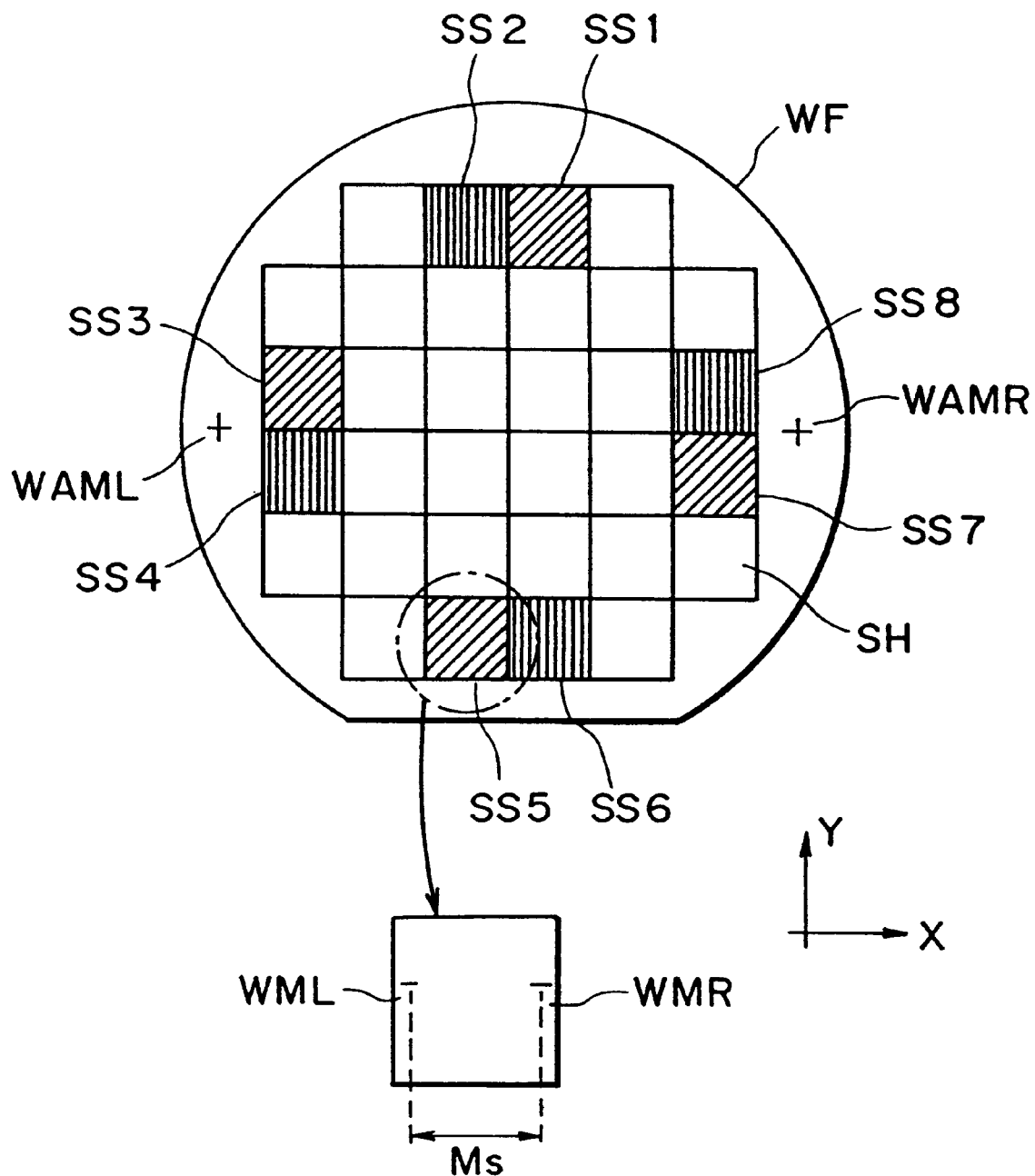
FIG. 3A is a plan view, schematically showing a wafer usable in the FIG. 1 embodiment.
FIG. 3B is a detail of that plan view.

Steps S05–S08 and Steps S09–S12 are the main part of the aligning method according to the present invention. While similar processings are performed at Steps S05–S08 and at Steps S09–S12, the operations to be made at Steps S05–S08 are those to be made when the number of sample shot areas to be selected as the subject of measurement is reduced (for example, only four preparatory sample shot areas SS1, SS3, SS5 and SS7 shown in FIG. 3 are selected) so as to obtain a medium alignment precision without expense of a long time. On the other hand, the operations to be made at Steps S09–S12 are those to be made when the number of sample shot areas to be selected as the subject of measurement is increased (for example, eight main sample shot areas SS1–SS8 in FIG. 3 are selected) so as to obtain high alignment precision. The alignment operation is repeated step by step because there is a tendency that the precision of deviation measurement is not so good when the amount of deviation is large and it is considered that the precision can be enhanced by reducing the deviation to zero step by step.

Step S05

Figure 15:
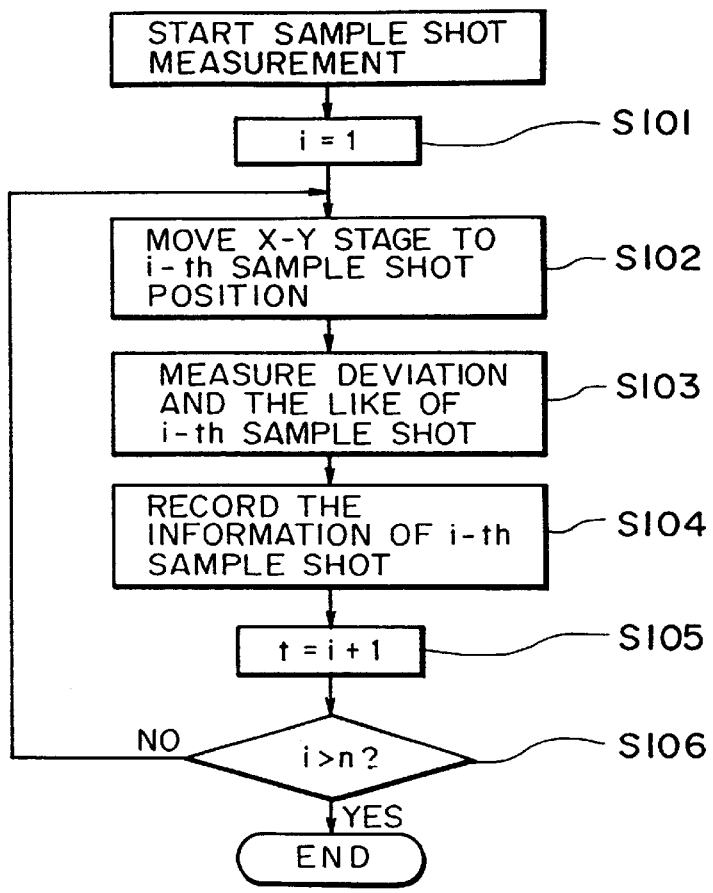
FIG. 15 is a block diagram, showing details of a major part of the flow chart of FIG. 14.

At this step, positional deviations of the preparatory sample shot areas SS1, SS3, SS5 and SS7 of FIG. 3, are measured in accordance with the sequence shown in the flow chart of FIG. 15. Details of this operation will be explained with reference to FIG. 15.

Step S101

First, the variable i (i=1–n where n is the number of the preparatory sample shot areas) is set to be equal to 1. Character "i" denotes a variable representing the ordinal number of that sample shot area and, hereinafter, it is used as a suffix when particular data different for each sample shot area is to be expressed.

Step S102

In the X-Y coordinates, a vector Pi representing the design position of the i-th sample shot area (see FIG. 16) is expressed as:

$$Pi = \begin{bmatrix} Pix \\ Piy \end{bmatrix}$$

and, from the vectors A and S obtained at step S04 described above, a vector qi representing the measuring position (FIG. 16) is detected in accordance with the following equation:

$q_i = Pi + APi + S$

Then, in accordance with this measuring position $q_i$, the movement of the X-Y stage XYS in the X and Y directions is controlled. In other words, the X-Y stage XYS movement is controlled so that the position represented by $q_i$ in the X-Y coordinates having an origin O at the optical axis position of the projection lens LN becomes coincident with the optical axis position of the projection lens LN. As a result of such movement, the i-th sample shot area can be placed at the deviation measuring position with a smaller error than on an occasion when it is moved to the design position Pi. As described hereinbefore, the design position Pi has been inputted into the control unit CU beforehand, from the console CS.

Step S103

Then, superposed images of the wafer marks $WML_x$, $WML_y$, $WMR_x$ and $WMR_y$ of the i-th sample shot area on the wafer WF and the reticle marks $RML_x$, $RML_y$, $RMR_x$ and $RMR_y$ on the reticle RT (see FIG. 4), are picked up through the image pickup device CM, and the image data from the image pickup device CM at this time is processed by the control unit CU, whereby various data related to the i-th sample shot area are produced. More specifically, as described, the position detecting device 23 in FIG. 2 calculates the positional deviations $D_{ilx}$, $D_{ily}$, $D_{irx}$ and $D_{iry}$, while the characteristic parameter extracting device 24 calculates the peak match degrees $P_{ilx}$, $P_{ily}$, $P_{irx}$ and $P_{iry}$, the variances $\sigma_{ilx}$, $\sigma_{ily}$, $\sigma_{irx}$ and $\sigma_{iry}$ of the measured values, the reticle mark deviations $\Delta RS_{ilx}$, $\Delta RS_{ily}$, $\Delta RS_{irx}$ and $\Delta RS_{iry}$, the shot magnification error $\Delta Mag_i$ and the shot rotational angle error $\Delta \theta i$.

If the shot area SH position on the wafer WF. is exactly at the design value Pi and the wafer alignment operation at Steps S03 and S04 has been accomplished idealistically accurately, naturally at this moment the wafer marks $WML_x$, $WML_y$, $WMR_x$ and $WMR_y$ of the sample shot area, which is the subject of measurement at this moment should be superposed upon corresponding reticle marks $RML_x$, $RML_y$, $RMR_x$ and $RMR_y$ each accurately in a predetermined positional relationship. Actually, however, there are positional deviations produced as a result of deformation of the wafer WF, a remainder of wafer alignment and the like.

Step S104

Various data of the i-th sample shot area obtained at the step S103 are recorded into variables such as set forth below, to allow reference at Step S06 and S07 (or Steps S10 and S11) to be described later:

Positional Deviation:
$D_{ilx} = D_{lx}$, $D_{ily} = D_{ly}$
$D_{irx} = D_{rx}$, $D_{iry} = D_{ry}$ Reticle Mark Spacing:
$RS_{ilx} = RS_{lx}$, $RS_{ily} = RS_{ly}$
$RS_{irx} = RS_{rx}$, $RS_{iry} = RS_{ry}$ Peak Match Degree:
$P_{ilx} = P_{lx}$, $P_{ily} = P_{ly}$
$P_{irx} = P_{rx}$, $P_{iry} = P_{ry}$ Variance of Measured Values:
$\sigma_{ilx} = \sigma_{lx}$, $\sigma_{ily} = \sigma_{ly}$
$\sigma_{irx} = \sigma_{rx}$, $\sigma_{iry} = \sigma_{ry}$ Shot Magnification Error:
$\Delta Mag_i = \Delta Mag$ Shot Rotational Angle Error:
$\Delta \theta_i = \Delta \theta$ Also, by taking the positional deviation of the center of the i-th sample shot area as a vector $M_i$ (see FIG. 16) and by taking the measured shot position as a vector $t_i$ (FIG. 16), the following is set:

Center Deviation:

$$m_i = \begin{bmatrix} D_x \\ D_y \end{bmatrix} = \begin{bmatrix} (D_{lx} + D_{rx})/2 \\ (D_{ly} + D_{ry})/2 \end{bmatrix}$$

Step S105

For the measurement to the next sample shot area, the variable i is incremented by one (1).

Step S106

Until the measurement to all the sample shot areas SSi (at step S05, the number n of the preparatory sample shot areas shown in FIG. 3 is n=4) is completed, Steps S102–S105 are repeated while moving the X-Y stage XYS in the X and Y directions on the basis of the measured position $q_i$ as described. At Step S105, this measurement is repeatedly performed four times and, thereafter, the sequence goes to Step S06 in FIG. 14.

Step S06 Here, by using various data obtained at Step S05, the characteristic parameter extracting device 24 determines the certainty $W_{ix}$ ($W_{iy}$) of the positional deviation $D_{ix}$ ($D_{iy}$) of the center of each sample shot area. This can be determined in the manner as described hereinbefore, and here it is not explained again.

Step S07

Figure 16:
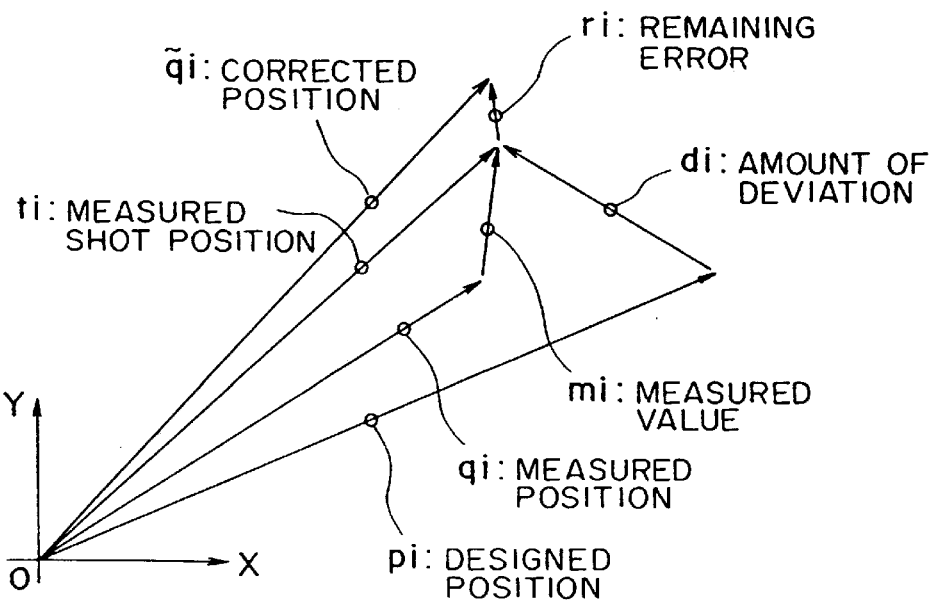
FIG. 16 is a schematic representation, showing the relationship among position vectors used in the explanation of the FIG. 1 embodiment.

After the certainty $W_{ix}$ and $W_{iy}$ is obtained, in order to determine the corrected position $\tilde{q}_i$ shown in FIG. 16, namely, in order to determine the position with which the movement of the X-Y stage XYS is to be controlled for step-and-repeat printing of the reticle pattern RT onto each shot area SH of the wafer WF, the control unit CU freshly calculates the following corrected values AS by using the measured position $t_i$ of each sample shot area and the designed position Pi of each sample shot area. That is:

$$A = \begin{bmatrix} \beta x & \theta y \\ \theta x & \beta y \end{bmatrix}, \quad S = \begin{bmatrix} Sx \\ Sy \end{bmatrix}$$

While these corrected values A and S can be calculated in many ways in the present embodiment they are calculated as follows:

Namely, on an assumption that the corrected position $\tilde{q}_i$ is to be approximated with a linear function, $q_i$ is expressed by:

$q_i = Pi + APi + S$ and the remainder $r_i$ to the measured position $t_i$ (see FIG. 16) when correction is made with the corrected position $\tilde{q}_i$ is expressed by:

$$r_i = \begin{bmatrix} r_{ix} \\ r_{iy} \end{bmatrix} = \tilde{q}_i - t_i$$

Then, the corrected values A and S are so determined that the sum of the squares of the remainders $r_{ix}$ and $r_{iy}$ weighted respectively with respective certainties $W_{ix}$ and $W_{iy}$, becomes minimum. The meaning of the certainty $W_{ix}$ and $W_{iy}$ is such as described hereinbefore, and it is determined so that a measured position $t_i$ having a high reliability is more influential to the corrected position (corrected grating) $\tilde{q}_i$. As described, a measured position (positional deviation) $t_i$ always contains a measurement error due to, for example, the mark configuration, the state of the applied resist and the expansion/contraction of the wafer WF. Also, for each sample shot area, the measurement error is different. Accordingly, if the corrected position $\tilde{q}_i$ (i.e., the corrected values A and S) is simply determined so as to minimize the sum of the squares of the remainders $r_i$, the certainty of the corrected position $\tilde{q}_i$ reduces correspondingly to the random measurement error contained in each measured position $t_i$ although the measurement error may be canceled to some extent by the least square method.

In consideration thereof, by weighting with the certainty $W_{ix}$ and $W_{iy}$, the control unit CU defines an evaluated quantity V such as:

$$V = \frac{1}{n}\sum_{i=1}^{n}\{W_{ix} \times (r_{ix})^2 + W_{iy} \times (r_{iy})^2\}$$

and determines the corrected values A and S so that the quantity V becomes minimum. That is:

$$\nabla V = 0$$

$$\text{where } \nabla = \begin{bmatrix} \partial/\partial\beta_x \\ \partial/\partial\beta_y \\ \partial/\partial\theta_x \\ \partial/\partial\theta_y \\ \partial/\partial S_x \\ \partial/\partial S_y \end{bmatrix}$$

$\beta x$, $\beta y$, $\theta x$, $\theta y$, $Sx$ and $Sy$ are calculated accordingly.

Here, if the deviation from the designed position Pi of the sample shot area is denoted by:

$$d_i = \begin{bmatrix} d_{ix} \\ d_{iy} \end{bmatrix} = t_i - P_i$$

then, $$r_i = AP_i + S - d_i$$

(as regards the relationship of the vectors, see FIG. 16) Accordingly, the above-described evaluated quantity V can be rewritten as:

$$V = \frac{1}{n}\sum_{i=1}^{n}\{W_{ix}(P_{ix}\beta x + P_{iy}\theta y + S_x - d_{ix})^2 +$$

$$W_{iy}(P_{iy}\beta y + P_{ix}\theta x + S_y - d_{iy})^2\}$$

$$= C_{xxx}\beta_x^2 + C_{yyy}\beta_y^2 + C_{yyx}\theta_x^2 + C_{xyy}\theta_y^2 +$$

$$2C_{xxy}\beta_x\theta_y + 2C_{yyx}\beta_y\theta_x +$$

$$2C_{xx}\beta_x S_x + 2C_{yy}\beta_y\theta_x +$$

$$2C_{xy}\theta_y S_x + 2C_{yx}\theta_x S_y +$$

$$C_x S_x^2 + C_y S_y^2 -$$

$$2D_{xxx}\beta_x - 2D_{yyy}\beta_y -$$

$$2D_{yyx}\theta_x - 2D_{xxy}\theta_y -$$

$$2D_{xx}S_x - 2D_{yy}S_y +$$

$$E_{xxx} + E_{yyy}$$

wherein $$C_{xxx} = \frac{1}{n}\sum_{i=1}^{n}(W_{ix}P_{ix}^2)$$

$$C_{yyy} = \frac{1}{n}\sum_{i=1}^{n}(W_{iy}P_{iy}^2)$$

$$C_{yxx} = \frac{1}{n}\sum_{i=1}^{n}(W_{iy}P_{ix}^2)$$

$$C_{xyy} = \frac{1}{n}\sum_{i=1}^{n}(W_{ix}P_{iy}^2)$$

$$C_x = \frac{1}{n}\sum_{i=1}^{n}(W_{ix})$$

$$C_y = \frac{1}{n}\sum_{i=1}^{n}(W_{iy})$$

$$C_{xxy} = \frac{1}{n}\sum_{i=1}^{n}(W_{ix}P_{ix}P_{iy})$$

$$C_{xx} = \frac{1}{n}\sum_{i=1}^{n}(W_{ix}P_{ix})$$

$$C_{xy} = \frac{1}{n}\sum_{i=1}^{n}(W_{ix}P_{iy})$$

$$C_{yyx} = \frac{1}{n}\sum_{i=1}^{n}(W_{iy}P_{iy}P_{ix})$$

$$C_{yy} = \frac{1}{n}\sum_{i=1}^{n}(W_{iy}P_{iy})$$

$$C_{yx} = \frac{1}{n}\sum_{i=1}^{n}(W_{iy}P_{ix})$$

$$D_{xxx} = \frac{1}{n}\sum_{i=1}^{n}(W_{ix}d_{ix}P_{ix})$$

$$D_{xxy} = \frac{1}{n}\sum_{i=1}^{n}(W_{ix}d_{ix}P_{iy})$$

$$D_{xx} = \frac{1}{n}\sum_{i=1}^{n}(W_{ix}d_{ix})$$

$$D_{yyy} = \frac{1}{n}\sum_{i=1}^{n}(W_{iy}d_{iy}P_{iy})$$

$$D_{yyx} = \frac{1}{n}\sum_{i=1}^{n}(W_{iy}d_{iy}P_{ix})$$

$$D_{yy} = \frac{1}{n}\sum_{i=1}^{n}(W_{iy}d_{iy})$$

$$E_{xxx} = \frac{1}{n}\sum_{i=1}^{n}(W_{ix}d_{ix}^2)$$

$$E_{yyy} = \frac{1}{n}\sum_{i=1}^{n}(W_{iy}d_{iy}^2)$$

It follows therefrom that $\nabla V=0$ is rewritten by:

$$\nabla V = 2\begin{bmatrix} C_{xxx} & 0 & 0 & C_{xxy} & C_{xx} & 0 & -D_{xxx} \\ 0 & C_{yyy} & C_{yyx} & 0 & 0 & C_{yy} & -D_{yyy} \\ 0 & C_{yyx} & C_{yxx} & 0 & 0 & C_{yx} & -D_{yyx} \\ C_{xxy} & 0 & 0 & C_{xyy} & C_{xy} & 0 & -D_{xxy} \\ C_{xx} & 0 & 0 & C_{xy} & C_{x} & 0 & -D_{xx} \\ 0 & C_{yy} & C_{yx} & 0 & 0 & C_{y} & -D_{yy} \end{bmatrix}\begin{bmatrix} \beta_x \\ \beta_y \\ \theta_x \\ \theta_y \\ S_x \\ S_y \\ 1 \end{bmatrix} = \begin{bmatrix} 0 \\ 0 \\ 0 \\ 0 \\ 0 \\ 0 \end{bmatrix}$$

By solving this, the following is obtained:

$\beta_x = \{D_{xxx}(C_{xyy}C_x - C_{xy}^2) + D_{xxy}(C_{xy}C_{xx} - C_{xxy}C_x) + D_{xx}(C_{xxy}C_{xy} - C_{xyy}C_{xx})\}/\det_x$ $\beta_y = \{D_{yyy}(C_{yxx}C_y - C_{yx}^2) + D_{yyx}(C_{yx}C_{yy} - C_{yyx}C_y) + D_{yy}(C_{yyx}C_{yx} - C_{yxx}C_{yy})\}/\det_y$ $\theta_x = \{D_{yyx}(C_{yyy}C_y - C_{yy}^2) + D_{yyy}(C_{yx}C_{yy} - C_{yyx}C_y) + D_{yy}(C_{yyx}C_{yy} - C_{yyy}C_{yx})\}/\det_y$ $\theta_y = \{D_{xxy}(C_{xxx}C_x - C_{xx}^2) + D_{xxx}(C_{xy}C_{xx} - C_{xxy}C_x) + D_{xx}(C_{xxy}C_{xx} - C_{xxx}C_{xy})\}/\det_x$ $S_x = \{D_{xx}\beta_x - C_{xy}\theta_y\}/C_x$ $S_y = \{D_{yy} - C_{yy}\beta_y - C_{yx}\theta_x\}/C_y$ wherein, $\det_x = C_{xxx}C_{xyy}C_x + 2C_{xxy}C_{xx}C_{xy} - C_{xxx}C_{xy}^2 - C_{xyy}C_{xx}^2 - C_xC_{xxy}^2$ $\det_y = C_{yyy}C_y + 2C_{yyx}C_{yx} - C_{yyy}C_{yx}^2 - C_{yxx}C_{yy}^2 - C_yC_{yyx}^2$ The corrected values A and S are determined in this manner and they are used later at Step S09 to calculate again the sample shot measuring position $q_i$.

Subsequently, the control unit CU calculates the amount of rotational drive ($\theta$c) of the reticle stage RS for correction of the chip rotation. To this end, the amount of chip rotation ($\theta$i) is expressed by using the wafer mark span MS (see FIG. 3), as follows:

$\theta i = (D_{iry} - D_{ily})/MS$

Then, while taking into consideration the certainty $W_{iy}$ in the Y direction, the rotational driving amount is determined as follows:

$$\theta_c = \frac{\sum_{i=1}^{n} W_{iy}\theta_i}{\sum_{i=1}^{n} W_{iy}}$$

Step S08

The reticle stage RS is rotationally moved in the $\theta$ direction by an amount $\theta$c (rotational driving amount) as obtained at Step S07, to adjust the chip rotation.

Subsequently, the number of sample shot areas SSi is increased to eight (i.e., the main sample shot areas SS1–SS8 of FIG. 3) and Steps S09–S12 similar to Steps S05–S08 are performed. Except for an increased number n of the sample shot areas, basically the Steps S09–S12 are the same as Steps S05–S08, such that they will be explained here briefly.
Step S09

While moving the X-Y stage XYS by using the measurement position $q_i$, the positional deviation of the main sample shot area SSi (i=1–8) is measured. The measurement position $q_i$ at this time is determined by using the corrected values A and S obtained at Step S07 as well as the designed position Pi. It is to be noted here that, at this step, with regard to the sample shot area SS1, SS3, SS5 and SS7 of all the selected sample shot areas SSi (i=1–8), the positional deviation has already been measured at Step S05 and, therefore, the measurement may not be performed again and the already obtained positional deviation may be used.
Step S10

The characteristic parameter extracting device 24 calculates the certainty $W_{ix}$ and $W_{iy}$ of the measured positional deviation of each sample shot area.
Step S11

Then, the corrected values A and S for determining the corrected position (corrected grating) $\tilde{q}_i$ is determined from the measured positional deviations of the eight sample shot areas and their certainties. Also, the amount of rotational drive ($\theta$c) of the reticle stage RS is calculated.
Step S12

The reticle stage RS is rotationally moved in the $\theta$ direction by an amount $\theta$c (rotationally driving amount) as determined at Step S11.

With the foregoing operations, the determination of the corrected position (corrected grating) $\tilde{q}_i$ of each shot area SH of the wafer WF is completed and, thereafter, while moving the X-Y stage XYS stepwise in accordance with the thus determined corrected grating (corrected coordinates), the pattern PT provided on the reticle RT is printed on each shot area SH.
Step S13

From the corrected values A and S obtained at Step S11 as well as the designed position Pi, the corrected position $\tilde{q}_i$ is determined as follows:

$\tilde{q}_i = Pi + APi + S$ and the movement of the X-Y stage XYS is controlled on the basis of the thus determined position $\tilde{q}_i$, whereby the i-th shot area SH is positioned exactly below the projection lens LN. Subsequently, the shutter SHT is opened to start the exposure with the printing light from the exposure light source IL, whereby the pattern of the reticle RT is printed on the i-th shot area SH through the projection lens LN. As the amount of exposure becomes equal to a predetermined amount (this value has been inputted in preparation into the control unit from the console CS), the shutter SHT is closed whereby the exposure of the i-th shot area SH is completed. Then, until the exposures of all the shot areas on the wafer WF are completed, the movement of the X-Y stage XYS based on the corrected position $\tilde{q}_i$ and the exposure operation are repeated.
Step S14

The wafer WF having its exposure completed is unloaded from the wafer stage WS by means of a conveying hand mechanism (not shown) and is stored into a wafer carrier (not shown).
Step S15

Steps S02–S15 are repeated until the exposure operation to all the wafers to be processed is completed.

With the operation described above, the alignment operation according to the present invention is completed.

Although the present invention has been explained in the foregoing to an embodiment wherein the positional deviation of each shot area SH of a wafer WF with respect to a reticle RT is detected by using reticle marks RML and RMR provided on the reticle RT and wafer marks WML and WMR provided on the wafer WF, as a matter of course the present invention is applicable also to a case wherein the position of each shot area is measured in a different method.

Figure 17:
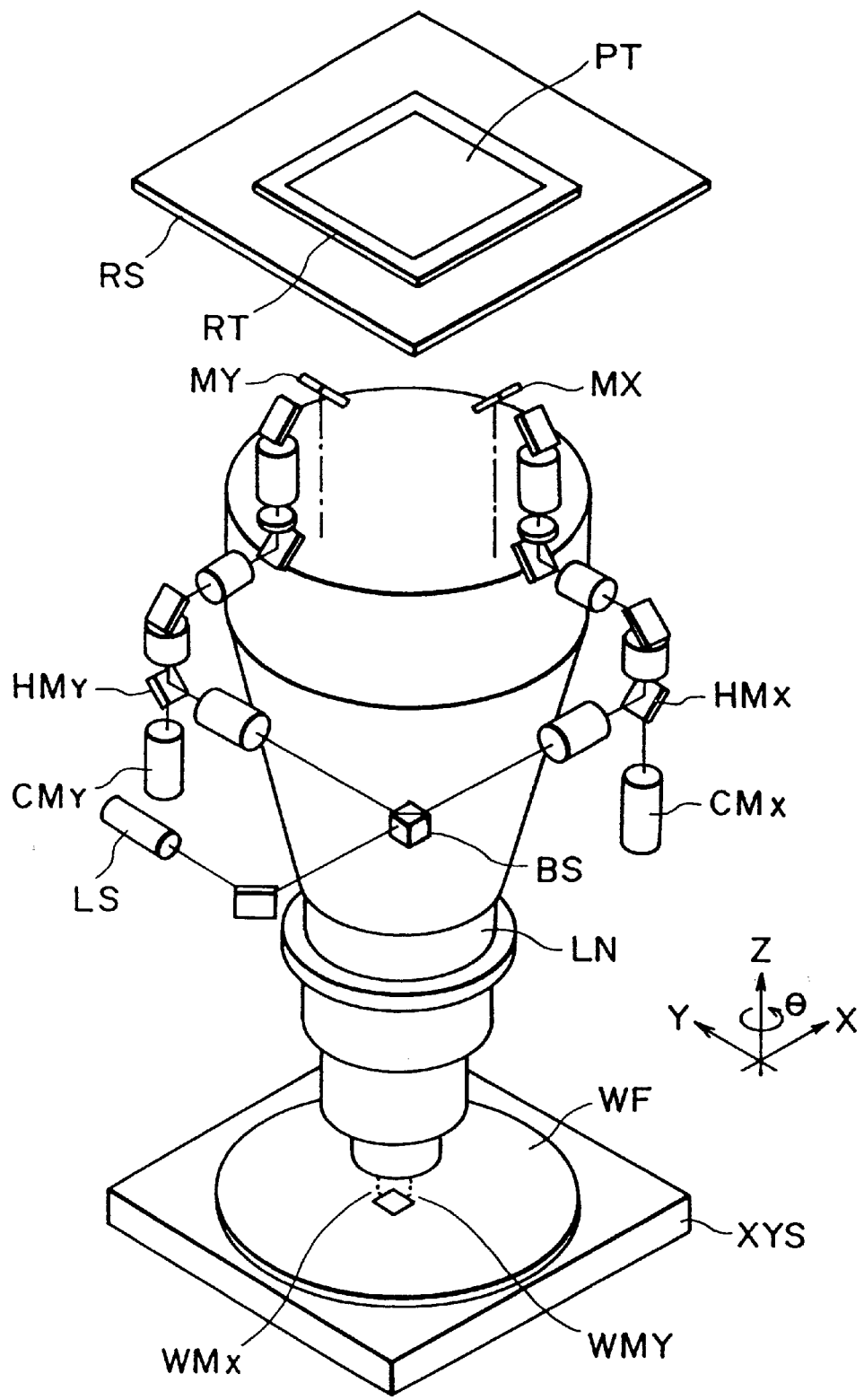
FIG. 17 is a perspective view, schematically showing a major part of a semiconductor device manufacturing step-and-repeat type exposure apparatus according to another embodiment of the present invention.

FIG. 17 shows a major part of a step-and-repeat type exposure apparatus, which is another example embodying the present invention and having a different arrangement for measuring the position of each shot area on a wafer WF. In FIG. 17, laser light from a light source LS is divided by a beam splitter BS into two optical paths and thereafter, from objective mirrors Mx and My disposed between a reticle stage RS and a projection lens LN, they are projected to the projection lens LN to illuminate wafer marks WMx and WMy provided on the wafer WF. Image pickup device CMx is provided to pick up an image of the wafer mark WMx through the projection lens LN, the objective mirror Mx and a half mirror HMx, while another image pickup device CMy is provided to pick up an image of the wafer mark WMy through the projection lens LN, the objective mirror My and a half mirror HMy. In this example, the positional deviation of the wafer mark WMx (WMy) is detected with respect to a predetermined reference position set in relation to the image pickup device CMx (CMy) such as, for example, the image pickup surface of the image pickup device CMx (CMy).

Also, in this example, provided that the positional relationship between the above-described reference position and the reticle RT held by the reticle stage RS is maintained with sufficient precision at a known value, the present invention is applicable similarly. Also, while in the embodiment described hereinbefore the positional deviation of each shot area is detected and the measuring position $q_i$ of each shot area is determined from the detected deviation and the designed position Pi of each shot area, the measuring position may be determined directly from the values measured through the laser interferometers IFX and IFY, for example. On that occasion, the measurement position to each shot area SH may be determined from the values obtained through the laser interferometers IFX and IFY when attainment of a predetermined positional relationship between the reticle mark and the wafer mark is discriminated on the basis of the video output from the image pickup device CM. Also, in the example of FIG. 17, it may be determined from the measured values of the laser interferometers IFX and IFY when coincidence of the wafer mark with the above-described reference position is discriminated on the basis of the video outputs of the image pickup devices CMx and CMy.

Further, while in the foregoing embodiments description has been made to an example wherein each mark is detected by using an image pickup device, the present invention is also applicable to a system having a photodetector such as disclosed in the aforementioned Japanese Laid-Open Patent Application, Laid-Open No. Sho 63-232321, for example. On that occasion, the certainty $W_{ix}$ and $W_{iy}$ may be determined by using as an evaluated quantity the waveform of a mark signal outputted from the photodetector. Further, the measurement of the position of each shot area SH by using wafer marks may be made without intervention of the projection lens LN. For example, a separate microscope which is held in a particular positional relationship with the projection lens LN at sufficient precision, such as an off-axis scope OS, may be used. On that occasion, the present invention is also applicable to the concept of what can be called a "latent image alignment" such as disclosed in Japanese Laid-Open Patent Application, Laid-Open No. Sho 61-114529, for example.

Further, while in the foregoing embodiments the certainty $W_{ix}$ and $W_{iy}$ is determined in accordance with the fuzzy reasoning, this may be determined in accordance with a different, more common method. As an example, if the conditional propositions (Pi→Qi) are defined as:

$$Qi = f_i(Pi)$$

where $i = 1-n$ and if, by using a method such as the multivariate analysis or the like, the factors of the conditional propositions of a number n are determined as $a_1$–$a_n$, respectively, then it is possible to determine the certainty $W_{ix}$ and $W_{iy}$ from the various data as described, in accordance with the linear additive association method or the linear multiplicative association method, for example.

In the case of linear additive association, assuming that the coefficient of the conditional proposition (Pi→Qi) for determining the certainty $W_{ix}$ is represented by $a_i$ (i=1–n) and that the conditional proposition (Pi→Qi) is represented by $$Qi = f_i(Pi),$$

then, the certainty $W_{ix}$ may be determined as follows:

$$W_{ix} = a_1 \cdot f_1 + a_2 \cdot f_2 + \ldots + a_i \cdot f_i + \ldots + a_n \cdot f_n$$

Also, assuming that the coefficient of the conditional proposition (Pi→Qi) for determining the certainty $W_{iy}$ represented by $b_i$ (i=1–m) and that the conditional proposition (Pi→Qi) is represented by:

$$Qi = g_i(Pi),$$

then, the certain $W_{iy}$ may be determined as follows:

$$W_{iy} = b_1 \cdot g_1 + b_2 \cdot g_2 + \ldots + b_i \cdot g_i + \ldots + b_m \cdot g_m$$

In the case of linear multiplicative association, similarly they may be determined as follows:

$$W_{ix} = a_1 \cdot f_1 \cdot a_2 \cdot f_2 \ldots a_i \cdot f_i \ldots a_n \cdot f_n$$

$$W_{iy} = b_1 \cdot g_1 \cdot b_2 \cdot g_2 \ldots b_i \cdot g_i \ldots b_m \cdot g_m$$

Also, if only one conditional proposition (Pi→Qi) is sufficient for determination of each of the certainty $W_{ix}$ and the certainty $W_{iy}$, they can be determined more simply. That is:

$$W_{ix} = f(Pi)$$

$$W_{iy} = g(Pi)$$

Further, while in the foregoing embodiments the calculation of the corrected position $\hat{q}_i$ of each shot area (namely, the corrected values A and S for determining the corrected coordinates (corrected grating)) is determined so as to make minimum the sum of the squares of the remainders $r_{ix}$ and $r_{iy}$ weighted with the certainty $W_{ix}$ and $W_{iy}$, this may be determined so as to make minimum the sum of the absolute values of the remainders $r_{ix}$ and $r_{iy}$ weighted with the certainty $W_{ix}$ and $W_{iy}$. Namely, an evaluated quantity $E_{abs}$ may be defined as:

$$E_{abs} = \sum_{i=1}^{n} [W_{ix} \times |r_{ix}| + W_{iy} + |r_{iy}|]$$

and the values A and S which are given by:

$$A = \begin{bmatrix} \beta_x & \theta_x \\ \theta_y & \beta_y \end{bmatrix}, \quad S = \begin{bmatrix} Sx \\ Sy \end{bmatrix}$$

and which make $E_{abs}$ minimum, may be determined.

Since the function $E_{abs}$ has a singular point, differentiation is not possible. For this reason, the analytic method such as described with reference to Step S07 in the preceding embodiment cannot be defined satisfactorily. Accordingly, on this occasion, the function $E_{abs}$ is considered as a function defined in a six-dimensional parameter space ($\beta x$, $\beta y$, $\theta x$, $\theta y$, $Sx$ and $Sy$) and the vector $\Phi \equiv (\beta x, \beta y, \theta x, \theta y, Sx$ and $Sy)$ on the six-dimensional space is deflected in a trial-and-error manner, and $\Phi_{solv}$ that makes $E_{abs}$ minimum is determined.

A basic concept of the determination of such $\Phi_{solv}$ will be explained below. For simplicity in explanation, the above-described $\Phi$ is defined as:

$$\Phi \equiv (\phi_1, \phi_2, \phi_3, \phi_4, \phi_5, \phi_6)$$
$$\equiv (x, y, \theta x, \theta y, Sx, Sy)$$

and the evaluation function $E_{abs}$ is set as $E_{abs}=E_{abs}(\Phi)$. Further, the unit vector as defined by $\Phi$ is represented by $\epsilon_u$ (u=1, 2, 3, 4, 5 and 6). Here, as an example:

$$\beta_x \epsilon_1 = (\beta x, 0, 0, 0, 0, 0)$$

First, as an initial value, $\Phi_0^0$ is given. While changing the vector $\Phi_0^0$ in the $\phi_1$ axis direction ($\beta x$ direction) by $\delta_1^0$, such $\delta_1$ that makes $E_{abs}$ minimum is set as $\delta_1^0$, where $$E_{abs}=E_{abs}(\Phi_0^0+\delta_1^0\epsilon_1)$$

and the vector value $\Phi_0^0$ is taken as the vector value $\Phi_1^0$. Here, $$\Phi_1^0=\Phi_0^0+\delta_1^0\epsilon_1$$

Subsequently, as regards $$E_{abs}=E_{abs}(\Phi_1^0+\delta_2^0\epsilon_2)$$

while changing $\delta_2^0$, the vector value that makes $E_{abs}$ is taken as $\Phi_2^0$. In this manner, with regard to the $\phi_u$ axes in sequence, such $\Phi_u^0$ that makes the function $E_{abs}$ minimum is determined, and $\Phi_6^0$ determined with respect to the $\phi_6$ axis direction is defined again as $\Phi_0^1$ ($\equiv \Phi_1^0$). Then, the $\phi_1$ axis is deflected again, and the vector value that makes $E_{abs}$ minimum is taken as $\Phi_1^1$, where $$E_{abs}=(\Phi_0^1\delta_1^1\epsilon_1)$$

In this manner, the vector values fur (u=1–6, r=0, 1, 2, . . . ) that makes $E_{abs}$ minimum are determined in sequence, where $$E_{abs}=(\Phi_{u-1}^r+\delta_u^r\epsilon_u)$$

Here, $\Phi_0^r \equiv \Phi_6^{r-1}$.

In actual calculation, $\delta_u^0$ is placed with sufficiently rough precision, while $\delta_u^R$ has a precision increasing with the increase of the suffix R. Finally, $\Phi_6^r$ as obtainable when the precision of $\delta_u^1$ becomes equal to or higher than one required, is taken as a solution $I_{solv}$.

Figure 18:
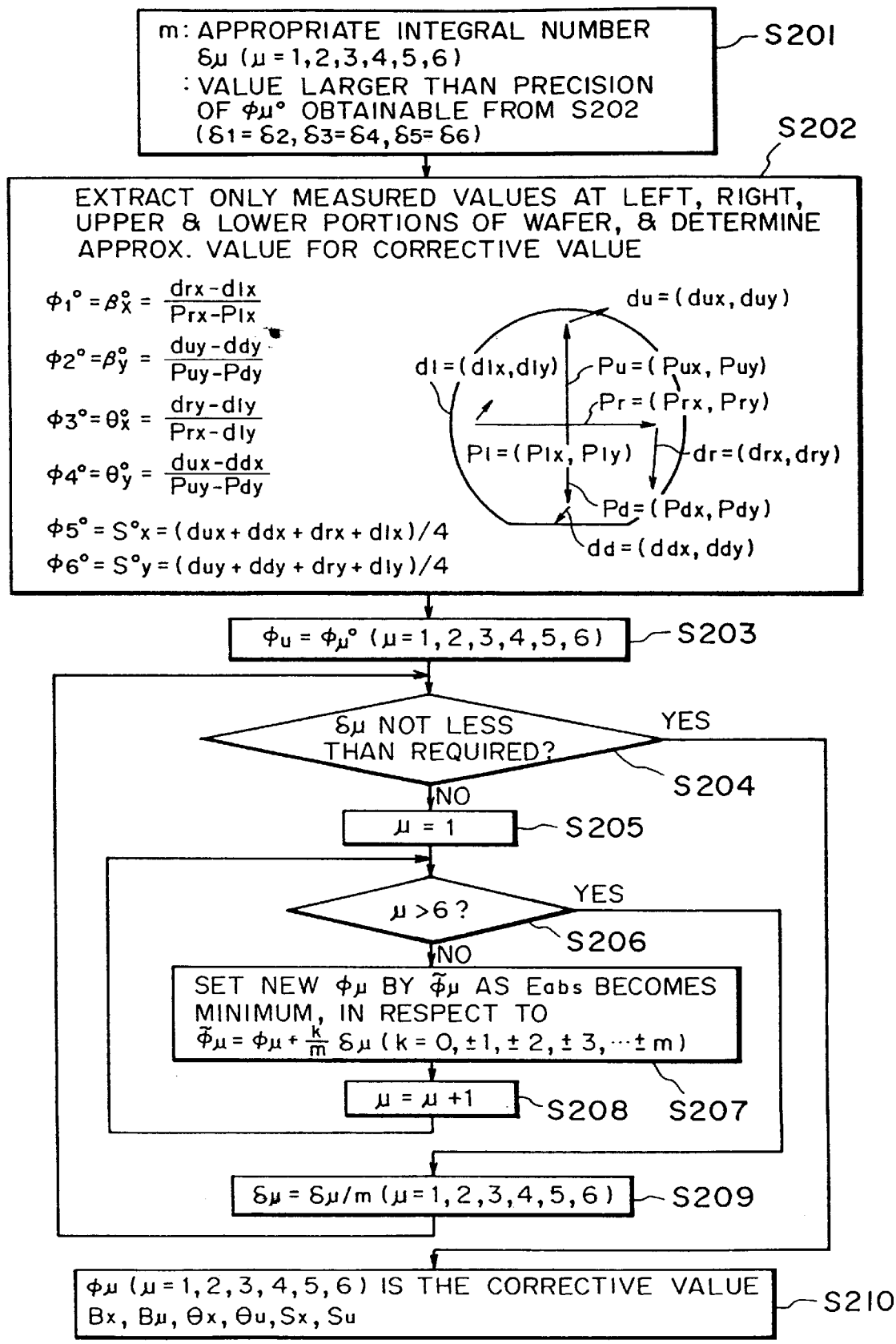
FIG. 18 is a flow chart showing another example of the sequence of an aligning operation.

Such a method of determination will be explained with reference to the flow chart of FIG. 18. At Step S201, an initial value for the parameter m that represents the degree of precision to be enhanced when the "R" is to be increased and also that represents the degree of deflection of the six-dimensional vector $\Phi$ as well as an initial value for $\delta_u$ that represents the roughness of $\delta_u^0$, are given. At Step S202, an initial value of the six-dimensional vector $\Phi$ is determined. For reasonable calculation, it is desirable that the initial value is close to the solution. To this end, the initial value is determined by using the equations as illustrated in the block of Step S202. The variables in these equations are defined in the chart given in the block of Step S202. Thereafter, in the loop corresponding to the change of the "R", $\Phi_6^R$ having higher precision is calculated and, if the precision is sufficient, after discrimination at Step S204 the sequence goes outwardly to Step S210. Of the loops, the loop comprising the Steps S205–S208 is the one for the "u". Then the aforementioned $\Phi_6^r$ is determined. The precision is enhanced and $\Phi_0^{r+1}=\Phi_6^r$ is obtained. This is made at Step S209. The components of the thus obtained $\Phi_{solv}$ are set as the corrected values A and S.

Further modified embodiments will be explained.

While in the preceding embodiment the corrected position $\tilde{q}_i$ is approximated with a linear function, this may be approximated with a non-linear function. For example, it is known that the disposition of shot areas on a wafer having been exposed with a certain type of mirror projection aligner can be approximated with a certain non-linear function (e.g. Japanese Laid-Open Patent Application, Laid-Open No. Sho 59-27525). Accordingly, when the aligning method of the present invention is to be applied to such a wafer, further enhancement of the alignment precision is possible by using the non-linear function such as disclosed in the aforementioned patent document, in place of the linear function as described hereinbefore. It is to be noted that, when the shot disposition is non-linear, in place of using the approximation with such a non-linear function, the wafer may be divided into plural zones and the aligning method of the preceding embodiment may be applied to each individual zone.

Further, while in the preceding embodiment the number of the sample shot areas is changed between Steps S05–S08 and Steps S09–S12 and the loop for determining the corrected position $\tilde{q}_i$ is performed twice, a large number of sample shot areas is initially used so that, with a single loop, the corrected position $\tilde{q}_i$ for the Step S13 may be determined. Alternatively, the number of the sample shot areas may be changed additionally, so as to repeatedly execute the loop not less than three times. Further, while the number of the sample shot areas is four at Step S05 and eight at Step S09, the invention is not limited to such numbers and any other arbitrary number may be used. As a matter of course, the position of the sample shot area SSi on the wafer is not limited to that as shown in FIG. 3, but it may be set as desired. They can be set as desired with the input from the console CS.

Further, while in the preceding embodiment description has been made of an example where the invention is applied to a semiconductor device manufacturing step-and-repeat type exposure apparatus, the invention is also applicable to any other apparatus. For example, the invention is applicable to an apparatus for directly drawing a pattern on each shot area on a workpiece such as a semiconductor wafer, by use of an electron beam, a laser beam or the like. Further, the invention is applicable to a wafer probe or the like to be used for the inspection of the characteristics of each chip pattern on a semiconductor wafer. Additionally, the invention is applicable to an apparatus other than that to be used in the manufacture of semiconductor devices. In summary, the invention is applicable to any apparatus provided that it is arranged to process or operate to each of different regions on an object while moving the object in the step-and-repeat manner.

In accordance with the present invention, as described hereinbefore, the corrected positional data related to the disposition of all the regions can be determined under stronger influence by a measured positional data having higher reliability. Therefore, it is possible to align each region in the step-and-repeat manner, with higher precision.

While the invention has been described with reference to the structures disclosed herein, it is not confined to the details set forth and this application is intended to cover such modifications or changes as may come within the purposes of the improvements or the scope of the following claims.

What is claimed is:

1. An aligning method for sequentially positioning different regions on a workpiece to a predetermined site, said method comprising the steps of:

detecting marks provided on selected regions on the workpiece to obtain corresponding mark signals and then measuring respective positional data related to the positions or positional errors of said selected regions, on the basis of the mark signals;

detecting the reliability of each measured positional data of a corresponding selected region, on the basis of the state of a corresponding mark signal or the state of that measured positional data;

preparing corrected positional data related to the disposition of all the regions on the workpiece by using the measured positional data of the selected regions and design positional data of the selected regions, wherein, for preparation of the corrected positional data, each measured positional data is weighted in accordance with the detected reliability thereof such that a measured positional data having higher reliability is more influential to determine the corrected positional data; and controlling movement of the workpiece, for sequential positioning of the different regions on the workpiece to the predetermined site, on the basis of the prepared corrected positional data.

2. An aligning method for sequentially positioning different regions on a workpiece to a predetermined site, said method comprising the steps of:

detecting marks provided on selected regions on the workpiece to obtain corresponding mark signals and then measuring respective positional data related to the positions or positional errors of said selected regions, on the basis of the mark signals;

detecting the reliability of each measured positional data of a corresponding selected region, on the basis of the state of a corresponding mark signal or the state of that measured positional data;

determining weighting values for the respective measured positional data of the selected regions, on the basis of the detected reliabilities of the respective measured positional data;

preparing corrected positional data related to the disposition of all the regions on the workpiece by using the measured positional data of the selected regions, design positional data of the selected regions and the determined weighting values; and controlling movement of the workpiece, for sequential positioning of the different regions on the workpiece to the predetermined site, on the basis of the prepared corrected positional data.

3. A method according to claim 2, wherein each weighting value is selected out of a predetermined numerical range including zero.

4. An aligning method for sequentially positioning different regions on a workpiece to a predetermined site, said method comprising the steps:

detecting images of marks provided on selected regions on the workpiece through image pickup means having windows to obtain corresponding image signals from the windows, and then measuring respective positional data related to the positions or positional errors of the selected regions on the basis of the image signals;

determining weighting values indicative of reliability for the respective measured positional data of the selected regions, on the basis of the respective states of the image signals or of the respective states of the measured positional data of the selected regions;

preparing corrected positional data related to the disposition of all the regions on the workpiece by using the measured positional data of the selected regions, design positional data of the selected regions and the determined weighting values; and controlling movement of the workpiece, for sequential positioning of the different regions on the workpiece to the predetermined site, on the basis of the prepared corrected positional data.

5. A method according to claim 4, wherein the determination of the weighting values of the measured positional data uses variance in the mark position as obtainable on the basis of the image signals from the windows.

6. An aligning method for sequentially positioning different regions on a workpiece to a predetermined site, said method comprising the steps of:

detecting marks provided on selected regions on the workpiece through a projection lens, for projecting a pattern of an original to each region on the workpiece, to obtain corresponding mark signals and then measuring respective positional data related to the positions or positional errors of the selected regions, on the basis of the mark signals;

determining weighting values indicative of reliability for the respective measured positional data of the selected regions, on the basis of the respective states of the mark signals or of the respective states of the measured positional data of the selected regions;

preparing corrected positional data related to the disposition of all the regions on the workpiece by using the measured positional data of the selected regions, design positional data of the selected regions and the determined weighting values; and controlling movement of the workpiece, for sequential positioning of the different regions on the workpiece to the predetermined site, on the basis of the prepared corrected positional data.

* * * * *

UNITED STATES PATENT AND TRADEMARK OFFICE
CERTIFICATE OF CORRECTION

PATENT NO. : 6,097,495

DATED : August 1, 2000

INVENTOR(S): SHIGEYUKI UZAWA, ET AL.

It is certified that error appears in the above-identified patent and that said Letters Patent is hereby corrected as shown below:

ON THE COVER PAGE:

UNDER [75] INVENTORS:

Line 1, "Nakamachi," should read --Tokyo,--.

UNDER [30] FOREIGN APPLICATION PRIORITY DATA:

"S1-115684" should read --1-115684--.

Figure 14:
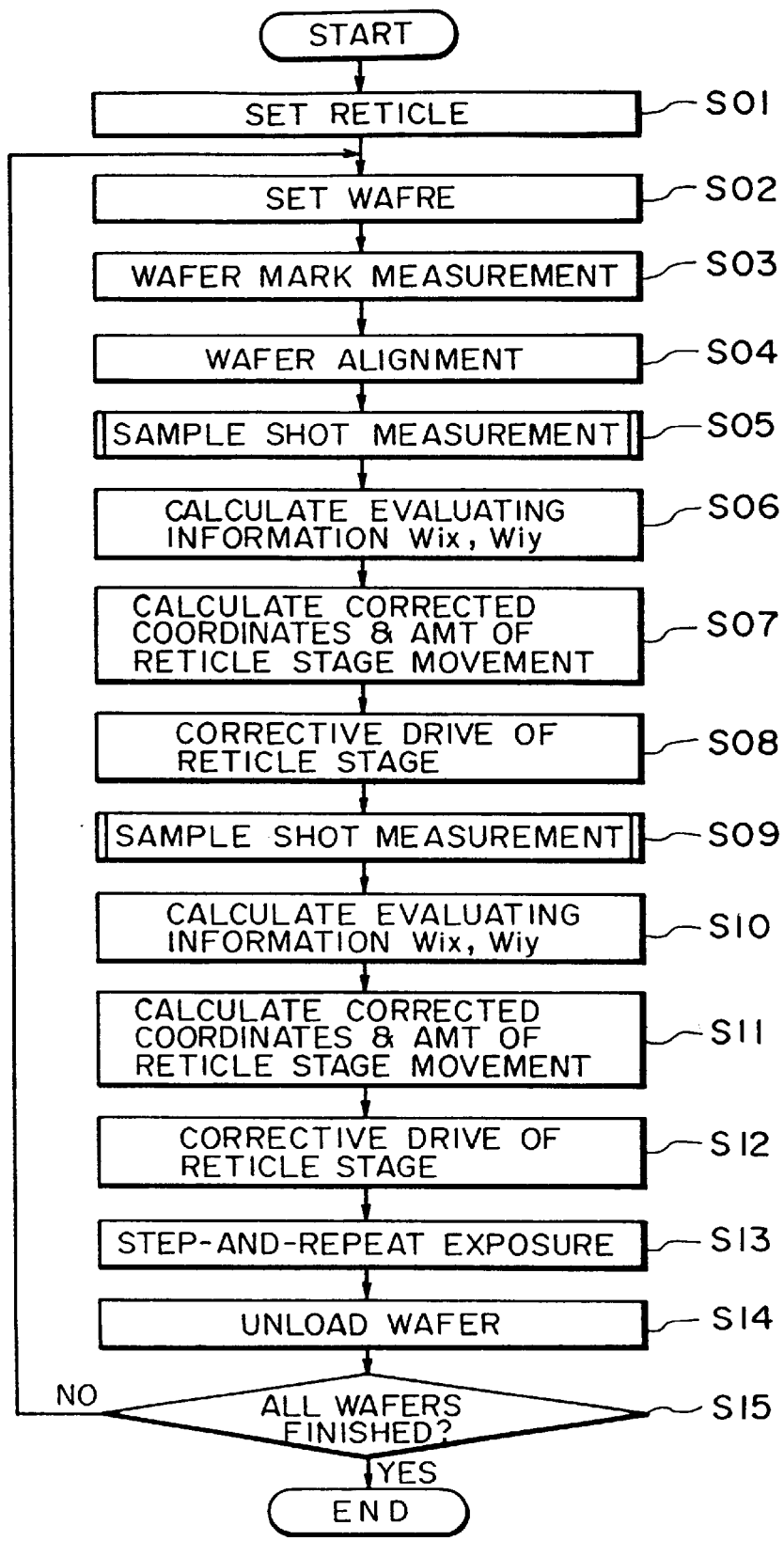
FIG. 14 is a flow chart showing the sequence of an aligning operation according to the FIG. 1 embodiment.

IN THE DRAWINGS:

SHEET 14:

Figure 14, In step S02 "WAFRE" should read --WAFER--.

IN THE DISCLOSURE:

COLUMN 20:

Line 7, "Step S105" should read

--Measured Deviation: $t_i = q_i + m_i$

Step S105--.

UNITED STATES PATENT AND TRADEMARK OFFICE
CERTIFICATE OF CORRECTION

PATENT NO. : 6,097,495

DATED : August 1, 2000

INVENTOR(S): SHIGEYUKI UZAWA, ET AL.

It is certified that error appears in the above-identified patent and that said Letters Patent is hereby corrected as shown below:

COLUMN 23:

Line 24, "$S_x = \{D_{xx}\beta_x - C_{xy}\theta_y\}/C_x$" should read

--$S_x = \{D_{xx} - C_{xx}\beta x - C_{xy}\theta_y\}/C_x$--.

Line 31, "$det_y = C_{yyy}C_y + 2C_{yyx}C_{yx}$" should read

--$det_y = C_{yyy}C_{yxx}C_y + 2C_{yyx}C_{yy}C_{yx}$--.

COLUMN 27:

Line 32, "$\delta_1^o.$" should read --$\tilde{\delta}_1^o.$--.

Line 33, "$\delta_1$" should read --$\tilde{\delta}_1^o$--.

Line 35, "$(\Phi_0^0 + \delta_1^0 e_1)$" should read --$(\Phi_0^0 + \tilde{\delta}_1^0 e_1)$--.

Line 43, "$(\Phi_1^0 + \delta_2^0 e_2)$" should read --$(\Phi_1^0 + \tilde{\delta}_2^0 e_2)$--.

Line 45, "$\delta_2^0,$" should read --$\tilde{\delta}_2^0,$--.

Line 53, "$(\Phi_0^1 + \delta_1^1 e_1)$" should read --$(\Phi_0^1 + \tilde{\delta}_1^1 e_1)$--.

Line 54, "fur" should read --$\Phi_u^r$--.

Line 58, "$(\Phi_{u-1}^r + \delta_u^r e_u)$" should read --$(\Phi_{u-1}^r + \tilde{\delta}_u^r e_u)$--.

Line 61, "$\delta_u^0$" should read --$\tilde{\delta}_u^0$--.

Line 62, "$\delta_u^r$" should read --$\tilde{\delta}_u^r$--.

Line 32, "$\delta_u^1$" should read --$\tilde{\delta}_u^1$--.

UNITED STATES PATENT AND TRADEMARK OFFICE
CERTIFICATE OF CORRECTION

PATENT NO. : 6,097,495

DATED : August 1, 2000, 1999

INVENTOR(S): SHIGEYUKI UZAWA, ET AL.

It is certified that error appears in the above-identified patent and that said Letters Patent is hereby corrected as shown below:

<u>COLUMN 28</u>:

Line 5, "$\delta_u^0$," should read --$\tilde{\delta}_u^0$,--.

Signed and Sealed this

Eighth Day of May, 2001

NICHOLAS P. GODICI

*Attesting Officer*     *Acting Director of the United States Patent and Trademark Office*